United States Patent
Kosaka et al.

[11] Patent Number: 5,992,320
[45] Date of Patent: Nov. 30, 1999

[54] TRANSFER SHEET, AND PATTERN-FORMING METHOD

[75] Inventors: Yozo Kosaka; Katsuhiko Mizuno; Takeshi Nakamura; Satoru Kuramochi; Masaaki Asano; Yoshiko Fujita; Yasunori Kurima, all of Tokyo, Japan

[73] Assignee: Dai Nippon Printing Co., Ltd., Tokyo, Japan

[21] Appl. No.: 08/953,599

[22] Filed: Oct. 17, 1997

[30] Foreign Application Priority Data

| Oct. 21, 1996 | [JP] | Japan | 8-276762 |
| Nov. 15, 1996 | [JP] | Japan | 8-304724 |
| Nov. 15, 1996 | [JP] | Japan | 8-304725 |

[51] Int. Cl.$^6$ .............. B41N 6/00; H01J 17/49
[52] U.S. Cl. ............. 101/401.1; 101/491; 313/582
[58] Field of Search ............... 101/401.1, 170, 101/491; 428/209; 313/584, 583, 581, 582; 333/219

[56] References Cited

U.S. PATENT DOCUMENTS

| 3,681,713 | 8/1972 | Degenkolb et al. | 333/219 |
| 4,369,220 | 1/1983 | Prabhu et al. | 428/209 |
| 4,479,432 | 10/1984 | Masaki et al. | 101/170 |
| 4,810,420 | 3/1989 | Prabhu et al. | |
| 5,201,268 | 4/1993 | Yamamoto et al. | |
| 5,264,758 | 11/1993 | Iijima et al. | 313/584 |
| 5,514,451 | 5/1996 | Kumar et al. | |
| 5,565,262 | 10/1996 | Azzaro et al. | |
| 5,581,876 | 12/1996 | Prabhu et al. | |
| 5,655,209 | 8/1997 | Casey et al. | 419/10 |
| 5,684,361 | 11/1997 | Seki et al. | 313/582 |
| 5,747,931 | 5/1998 | Riddle et al. | 313/581 |

FOREIGN PATENT DOCUMENTS

| 0 802 170 | 3/1989 | European Pat. Off. |
| 0 452 118 | 10/1991 | European Pat. Off. |
| WO 96/22949 | 8/1996 | WIPO |
| WO 96/39298 | 12/1996 | WIPO |

*Primary Examiner*—Eugene Eickholt
*Attorney, Agent, or Firm*—Dellett and Walters

[57] ABSTRACT

It is an object of the invention to provide a transfer sheet which is suitable for forming high-precision patterns for electrode layers, dielectric layers, barrier layers, etc. in the process of fabricating plasma display panels, image display devices, thermal heads, integrated circuits, etc., and which enables fabrication times to be reduced with improved yields, and has improved surface smoothness, a uniform thickness and good profile precision, and a pattern-forming method. The transfer sheet of the invention comprises a base film 11 having a concave pattern formed on one side thereof and an ink layer 13 filled in the concave pattern portion 12 in the base film 11, said ink layer being composed of an inorganic component comprising at least a glass frit and a resinous component that is to be removed by firing. Preferably, a second ink layer is stacked on the concave pattern with the ink layer filled therein, and a third ink layer is stacked on the second ink layer. In the pattern-forming method of the invention, the transfer sheet is laminated from an ink layer side thereof on an associated substrate to transfer the concave pattern onto the associated substrate, and the associated substrate having the concave pattern is then fired.

8 Claims, 14 Drawing Sheets

TRANSFER SHEET, AND PATTERN-FORMING METHOD

BACKGROUND OF THE INVENTION

The present invention relates to a transfer sheet suitable for forming high-precision patterns for layers such as electrode layers, dielectric layers and barrier layers in plasma display panels (hereinafter PDPs for short), field emission displays (FEDs), liquid crystal display devices (LCDs), vacuum fluorescent displays, hybrid integrated circuits, etc., and a pattern-forming method.

As well known so far in the art, such patterns are formed by the pattern-wise coating of an ink for conductors or insulators on a suitable substrate of such as a glass or ceramic substrate by means of screen printing, and the firing of the substrate, thereby obtaining a thick pattern in close contact with the substrate. According to this technique, for instance, fine lines having a line width of 100 $\mu$m and a height of 100 $\mu$m are formed by repeating superposition printing plural times.

However, the method of forming a pattern by repeating screen pattern printing many times have several problems. First, the expansion and contraction of the screen used for printing occurs unavoidably. In most applications where various patterns are formed while they are superposed one upon another, they are susceptible to misalignment. Second, the screen used as a printing plate tends to give rise to pattern distortions, so making it difficult to form micro patterns. Third, wiping is necessary for each printing because of the migration of the pattern-forming material to the back side of the screen plate; that is, automation is difficult. Fourth, pattern size achievable by screen printing is at most about 100 $\mu$m for width, and pattern shape is about 0.5 as expressed by a half width-to-bottom width ratio, where the half width is a width of a pattern-forming layer at a position half the height of the pattern-forming layer. For a barrier layer in a PDP which should be coated at an as-dried thickness of about 150 $\mu$m to about 200 $\mu$m, for instance, it is required to increase its bottom area, and so it is impossible to form any fine pattern. For a multilayer pattern, layers are stacked one upon another while alignment is carried out per layer because it cannot be formed in one operation. However, this offers a problem that it is difficult to improve alignment precision. Further, it is impossible to form a thick pattern having a high aspect ratio because the ink tails due to its fluidity. Furthermore, difficulty is involved in condition controls for the purpose of preventing contamination with foreign matters or the like because operations must be carried out in an open system, and so much time is needed for pattern fabrication.

There is also known a so-called sand blasting technique wherein a pattern-forming layer is solid coated on a substrate by repeating screen printing many times, then using a photosensitive resist to form a sand blasting mask on the pattern-forming layer, and finally jetting an abrasive for the patterning of the pattern-forming layer.

However, a pattern-forming method making use of this sand blasting technique, too, has a problem that a superposition printing step is not only time-consuming but also condition controls are difficult to perform because operations must be carried out in an open system. Further, coating and drying must be repeated for each layer to be formed, followed by patterning. This leads to another problem that much installation cost is not only needed but also much space is need for such installations.

A first object of the present invention is to provide a transfer sheet suitable for forming micro patterns for electrodes, resistors, barriers, etc. in image display devices such as PDPs and liquid crystal displays, thermal heads, integrated circuits and the like.

A second object of the present invention is to provide a pattern-forming method of forming a pattern having improved surface smoothness, a uniform thickness and high profile precision for a reduced time of period in high yields.

SUMMARY OF THE INVENTION

A first transfer sheet of the present invention is characterized by comprising a base film having a concave pattern formed on one side thereof and an ink layer filled in a depressed space in said base film, said ink layer being composed of an inorganic component comprising at least a glass frit and a resinous composition that is to be removed by firing.

The first transfer sheet is preferably characterized in that said transfer sheet is a transfer sheet for fabricating a plasma display panel, and said ink layer is an electrode-forming layer.

The first transfer sheet is preferably characterized in that said electrode-forming layer is an electroconductive ink layer composed of an inorganic component comprising at least a glass frit and a resinous component that is to be removed by firing, a dark electroconductive ink layer in which said electroconductive ink layer contains a dark pigment, or a multilayer structure comprising said electroconductive ink layer and said dark electroconductive ink layer.

The first transfer sheet is preferably characterized in that said transfer sheet is a transfer sheet for fabricating a plasma display panel, and said ink layer is a barrier-forming layer.

The first transfer sheet is preferably characterized in that said barrier layer comprises a white or dark ink layer composed of an inorganic component comprising at least a glass frit and a resinous component that is to be removed by firing, or a multilayer structure comprising said white ink layer and said dark ink layer.

A second transfer sheet of the present invention is characterized by comprising a base film having a concave pattern formed on one side thereof, a first ink layer filled in a depressed space in said base film, said first ink layer being composed of an inorganic component comprising at least a glass frit and a resinous composition that is to be removed by firing, and a second ink layer stacked on said concave pattern with said first ink layer filled therein, said second ink layer being composed of an inorganic component comprising at least a glass frit and a resinous composition that is to be removed by firing.

The second transfer sheet is preferably characterized in that said transfer sheet is a transfer sheet for fabricating a plasma display panel, and said first ink layer is an electrode-forming layer while said second ink layer is a primer-forming layer.

The second transfer sheet is preferably characterized in that said transfer sheet is a transfer sheet for fabricating a plasma display panel, and said first ink layer is a barrier-forming layer while said second ink layer is a dielectric-forming layer.

The second transfer sheet is preferably characterized in that said barrier layer comprises a white or dark ink layer composed of an inorganic component comprising at least a glass frit and a resinous component that is to be removed by firing, or a multilayer structure comprising said white ink layer and said dark ink layer.

A third transfer sheet of the present invention is characterized by comprising a base film having a concave pattern formed on one side thereof, a first ink layer filled in a depressed space in said base film, said first ink layer being composed of an inorganic component comprising at least a glass frit and a resinous composition that is to be removed by firing, a second ink layer stacked on said concave pattern with said first ink layer filled therein, said second ink layer being composed of an inorganic component comprising at least a glass frit and a resinous composition that is to be removed by firing, and a third ink layer stacked on said second ink layer.

The third transfer sheet is preferably characterized in that said transfer sheet is a transfer sheet for fabricating a plasma display panel, while said ink layer is a barrier-forming layer comprising a white or dark ink layer composed of an inorganic component comprising at least a glass frit and a resinous component that is to be removed by firing, or a multilayer structure comprising said white ink layer and said dark ink layer, said second ink layer is a dielectric-forming layer, and said third ink layer is an electrode-forming layer.

A first pattern-forming method of the present invention is characterized in that a transfer sheet, which comprises a base film having a concave pattern formed on one side thereof and an ink layer filled in a depressed space in said base film, said ink layer being composed of an inorganic component comprising at least a glass frit and a resinous composition that is to be removed by firing, is laminated from said ink layer side thereof onto an associated substrate to transfer said ink layer onto said associated substrate, and said associated substrate with said ink layer transferred thereonto is then fired.

A second pattern-forming method of the present invention is characterized in that a transfer sheet, which comprises a base film having a concave pattern formed on one side thereof, a first ink layer filled in a depressed space in said base film, said first ink layer being composed of an inorganic component comprising at least a glass frit and a resinous composition that is to be removed by firing, and a second ink layer stacked on said concave pattern with said first ink layer filled therein, said second ink layer being composed of an inorganic component comprising at least a glass frit and a resinous composition that is to be removed by firing, is laminated from said second ink layer side thereof onto an associated substrate to simultaneously transfer said first and second ink layers onto said associated substrate, and said associated substrate with said first and second ink layers transferred thereonto is then fired.

A third pattern-forming method of the present invention is characterized in that a transfer substrate, which comprises a base film having a concave pattern formed on one side thereof, a first ink layer filled in a depressed space in said base film, said first ink layer being composed of an inorganic component comprising at least a glass frit and a resinous composition that is to be removed by firing, a second ink layer stacked on said concave pattern with said first ink layer filled therein, said second ink layer being composed of an inorganic component comprising at least a glass frit and a resinous composition that is to be removed by firing, and a third ink layer stacked on said second ink layer, is laminated from said third ink layer side thereof onto an associated substrate to simultaneously transfer said first, second and third ink layers onto said associated substrate, and said associated substrate with said first, second and third ink layers transferred thereonto is then fired.

Any one of the aforesaid pattern-forming methods is preferably characterized in that said pattern-forming method is a method for fabricating a plasma display panel, said associated substrate is a plasma display panel substrate, and said ink layer pattern is a plasma display panel member pattern.

A fourth pattern-forming method of the present invention is characterized by comprising:

(1) a first step of, while a roll intaglio having a concave pattern formed on one side thereof is being rotated, filling an ink layer in a depression in said roll intaglio, said ink layer being composed of an inorganic component comprising at least a glass frit and a resinous component that is to be removed by firing, (2) a second step of bringing a base film into contact with said ink layer which has been filled in said roll intaglio at said first step, said base film being carried in synchronism with a rotating direction of said roll intaglio, (3) a third step of, while said base film is in contact with said roll intaglio at said second step, curing said ink layer between said roll intaglio and said base film, and bringing said ink layer that is being cured into close contact with said base film, (4) a fourth step of releasing a pattern-wise cured ink layer and said base film, both being in close contact with each other at said third step, from said roll intaglio to form a transfer sheet, (5) a fifth step of laminating said transfer sheet obtained at said fourth step from said pattern-wise cured ink layer side onto a glass substrate, and then releasing said base film from said cured ink layer to transfer a cured product of said ink layer onto said glass substrate, and (6) a sixth step of firing said glass substrate having said pattern-wise cured ink layer, obtained at said fifth step.

The fourth pattern-forming method is preferably characterized in that the pattern to be formed is an electrode layer pattern or a barrier layer pattern in a plasma display panel member.

A fifth pattern-forming method of the present invention is characterized by comprising:

(1) a first step of filling a photo-curable ink layer in a depression in an intaglio, said depression corresponding to a desired pattern, (2) a second step of laminating a film having a release agent layer on said intaglio while said release agent layer is opposite to said depression, (3) a third step of releasing said film from said intaglio to transfer said ink layer from within said depression onto said film, (4) a fourth step of superposing said film on a substrate in such a manner that said ink layer comes into contact with said substrate, (5) a fifth step of irradiating said ink layer and said substrate with ultraviolet rays to increase an adhesion strength of said ink layer to said substrate, (6) a sixth step of releasing said film to leave said ink layer on said substrate, and (7) a seventh step of firing the whole of said substrate, thereby bringing said ink layer into close contact with said substrate.

One modification of the fifth pattern-forming method of the present invention is characterized by comprising:

(1) a first step of coating a photo-curable ink layer on a surface of an intaglio having a depression formed therein corresponding to a desired pattern, said surface including said depression, and an irregular surface of a side of said intaglio having said depression being subjected to a release treatment, (2) a second step of pressing a substrate on said ink layer coated with an adhesive sandwiched therebetween, (3) a third step of exposing said substrate through a mask corresponding to said depression to cure said ink layer in said depression, (4) a fourth step of releasing said substrate from said intaglio to transfer said ink layer onto said substrate, and (5) a fifth step of firing the whole of said substrate to bring said ink layer into close contact with said substrate.

With the transfer sheet or sheets of the present invention it is possible to reduce the time needed for, and improve the yield of, fabricating electrode layers, dielectric layers, and barrier layers in PDPs, image display devices, thermal heads, integrated circuits, and the like. With the pattern obtained by transfer, it is possible to form a layer having improved surface smoothness, a uniform thickness, and good profile precision. In addition, only the pattern portion can be transferred, and so cost reductions can be achieved due to a decrease in the amount of material used.

Moreover, the pattern-forming method or methods of the present invention dispenses with such repeated pattern printing and firing operations as carried out in the prior art, and so enable patterns to be obtained in one printing/firing operation, so that operating times can be reduced with improvements in the dimensional precision and alignment precision of patterns.

DESCRIPTION OF THE PREFERRED EMBODIMENTS

The transfer sheets, and pattern-forming methods according to the present invention will now be explained specifically with reference to PDP fabrication.

Figure 21:
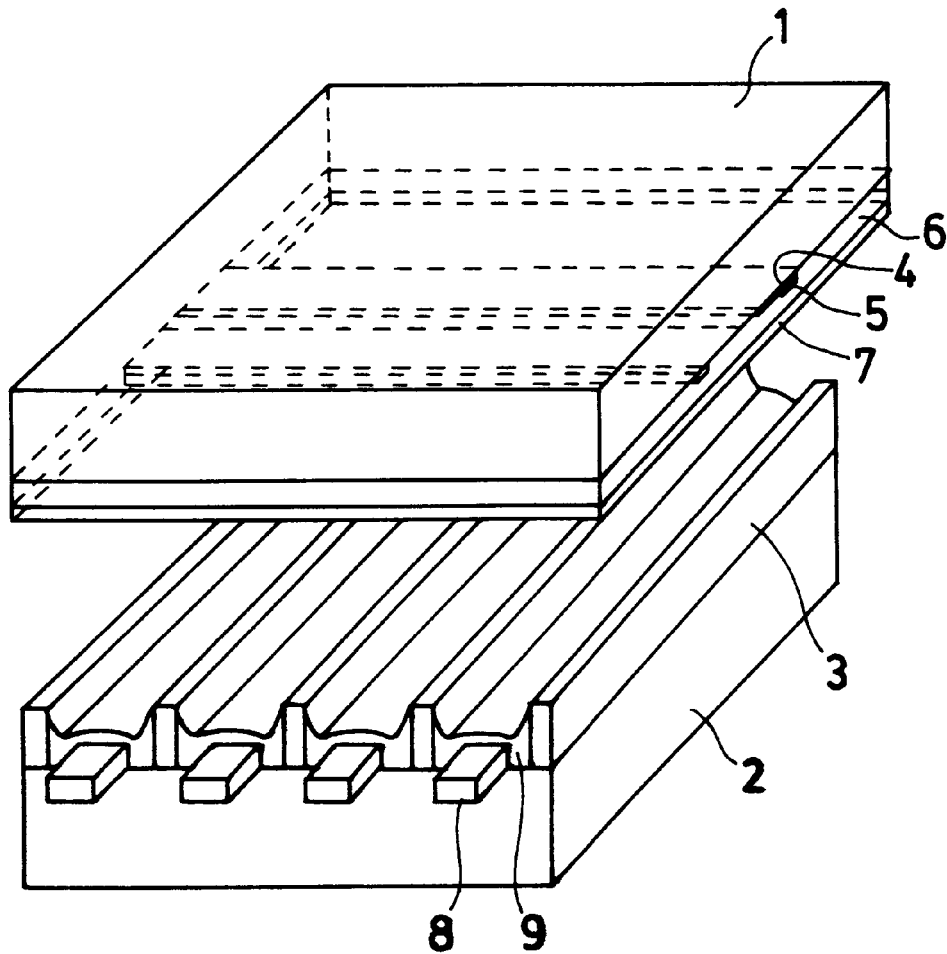
FIG. 21 is a perspective schematic illustrative of one embodiment of an AC type plasma display panel.

As typically shown in FIG. 21, an AC type PDP comprises two glass substrates 1 and 2 located parallel with and in opposition to each other. Both the substrates are held at a constant spacing by cell barriers 3 placed on the glass substrate or back plate 2 in parallel relation to each other. On the back side of the glass substrate or front plate 1 there are located parallel composite electrodes, each formed of a transparent electrode 4 that is a sustained discharge electrode and a metal electrode 5 that is a bus electrode. The composite electrodes are provided thereon with a dielectric layer 6, which is in turn provided thereon with a protective (MgO) layer. On the front side of the glass substrate or back plate 2 there are located parallel address electrodes 8. The address electrodes 8 are positioned between the cell barriers 3 in such a manner that they intersect at right angles with the composite electrodes. The sides and bottoms of the cell barriers 3 are covered with a fluorescent surface 9.

Figure 22:
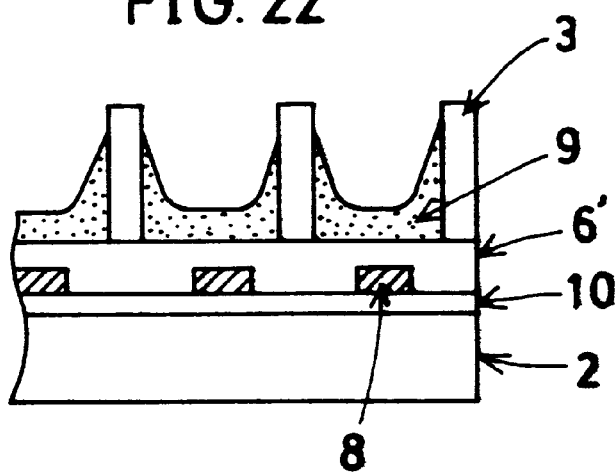
FIG. 22 is a schematic illustrative of another embodiment of an AC type plasma display panel.

Alternatively, address electrodes 8, a dielectric layer 6', cell barriers 3 and a fluorescent layer 9 may be successively stacked on a glass substrate or back plate which has been provided thereon with a primer layer 10, as shown in FIG. 22.

This AC type PDP is of a surface discharge structure wherein alternating voltage is applied across the composite electrodes on the front plate to cause discharge by an electric field leaking out in the spaces. In this case, the direction of the electric field changes depending on frequency because the alternating voltage is applied on the electrodes. Ultraviolet rays resulting from this discharge allow the fluorescent surface 9 to emit light, so that the observer can view the light transmitting through the front plate. It is noted that a DC type PDP is different from the AC type PDP in that electrodes are not covered with a dielectric layer, but is similar thereto in terms of the resulting discharge phenomenon.

The first transfer sheet of the present invention is used for the fabrication of such PDPs, as explained below at great length with reference to the accompanying drawings.

Figure 1:
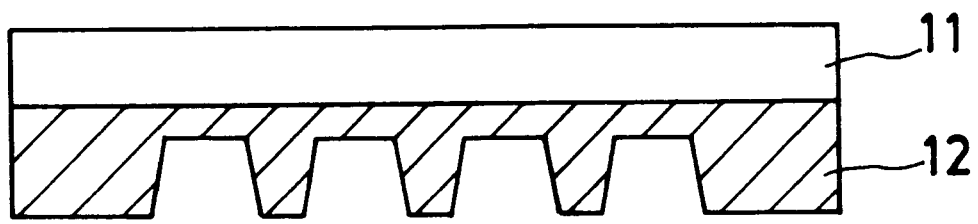
FIG. 1 is a sectional schematic illustrative of a base film having a concave pattern formed thereon.
Figure 2:
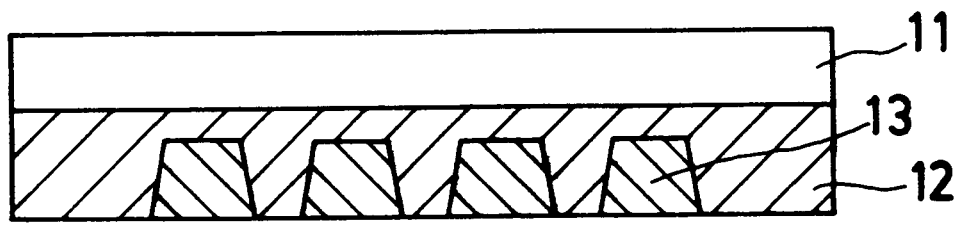
FIG. 2 is a sectional schematic illustrative of the first transfer sheet according to the present invention.

FIG. 1 is a sectional view illustrative of a base film 11 with a concave pattern 12 formed thereon, and FIG. 2 is a sectional view illustrative of the first transfer sheet of the present invention. In FIGS. 1 and 2 reference numeral 11 represents a base film, 12 a concave pattern, and 13 an ink layer.

The concave pattern 12 may be formed on the base film 11 by filling ink in an intaglio or roll intaglio, said ink made up of curable resins, e.g., ionizing radiation-curable resin, ionizing radiation-disintegrating resin, and heat-curable resin or thermoplastic resins, and transferring the ink onto the base film. For the intaglio, a deep-etch plate or roll intaglio may be used.

For the ionizing radiation-curable resin, ultraviolet or electron beam-curable resins may be used. More specifically, compositions obtained by mixing together prepolymers, oligomers and/or monomers having a polymerizable unsaturated bond or an epoxy group in their molecule may be used to this end.

The prepolymers, and oligomers used herein, for instance, may include unsaturated polyesters such as condensates of unsaturated carboxylic acids and polyhydric alcohols, epoxy resins, methacrylates such as polyester methacrylate, polyether methacrylate, polyol methacrylate, polyglycidyl methacrylate, and chloromethylated naphthyl methacrylate, acrylates such as polyester acrylate, polyether acrylate, and polyol acrylate, chloromethylated polystyrene, chlorinated polymethylstyrene, iodized polystyrene, polymethacrylate-maleic acid copolymers, polyglycidyl methacrylate-ethyl acrylate copolymers, glycidyl methacrylate-styrene copolymers, epoxidized polybutadiene, polydiallyl phthalate, partially chlorinated polyvinyl-toluene, and chloromethylated polydiphenylsiloxane.

The monomers used herein may include compounds having at least one polymerizable carbon-carbon unsaturated bond, for example, acrylates such as allyl acrylate, benzyl acrylate, butoxyethyl acrylate, butoxyethylene glycol acrylate, cyclohexyl acrylate, dicyclopentanyl acrylate, dicyclopentenyl acrylate, 2-ethylhexyl acrylate, glycerol acrylate, glycidyl acrylate, 2-hydroxyethyl acrylate, 2-hydroxypropyl acrylate, isobornyl acrylate, isodecyl acrylate, isooctyl acrylate, lauryl acrylate, 2-methoxyethyl acrylate, methoxyethylene glycol acrylate, phenoxyethyl acrylate, stearyl acrylate, ethylene glycol diacrylate, diethylene glycol diacrylate, 1,4-butanediol diacrylate, 1,5-pentanediol diacrylate, 1,6-hexanediol diacrylate, 1,3-propanediol diacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethylated trimethylolpropane triacrylate, pentaerythritol triacrylate, pentaerythritol tetraacrylate, triethylene glycol diacrylate, polyoxypropylt-rimethylolpropane triacrylate, butylene glycol diacrylate, 1,2,4-butanetriol triacrylate, 2,2,4-trimethyl-1,3-pentanediol diacrylate, diallyl fumarate, 1,10-decanedioldimethyl diacrylate, and dipentaerythritol hexaacrylate; methacrylate analogues of said methacrylate compounds; γ-methacryloxy-propyltrimethoxysilane; and 1-vinyl-2-pyrrolidone. These monomers may be used alone or in combination of two or more.

Especially for the ultraviolet curable resins, the aforesaid compositions may be used in combination with photo-initiators such as photo-reducible dyes, for instance, benzophenone, methyl o-benzoylbenzoate, 4,4-bis(dimethylamino)benzophenone, 4,4-bis(diethylamino)benzophenone, α-aminoacetophenone, 4,4-dichlorophenone, 4-benzoyl-4-methyl diphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyl dimethyl ketal, benzyl methoxyethyl acetal, benzoin methyl ether, benzoin butyl ether, anthraquinone, 2-tert-buthylanthraquinone, 2-amylanthraquinone, β-chloroanthraquinone, anthrone, benzanthrone, methyleneanthrone, 4-azidobenzylacetophenone, 2,6-bis(p-azidobenzilidene)cyclohexane, 2,6-bis(p-azidobenzilidene)-4-methylcyclohexanone, 2-phenyl-1,2-butadion-2-(o-methoxycarbonyl)oxime, 1-phenyl-propanedion-2-(o-ethoxycarbonyl)oxime, 1,3-diphenyl-propanetrion-2-(o-ethoxycarbonyl)oxime, 1-phenyl-3-ethoxy-propanetrion-2-(o-benzoyl)oxime, Michler's ketone, 2-methyl-[4-(methylthio) phenyl]-2-morpholino-1-propane, naphthalenesulfonyl chloride, quinolinesulfonyl chloride, n-phenylthioacridone, 4,4-azobisisobutyronitrile, diphenyl disulfide, benzothiazole disulfide, triphenylphosphine, camphorquinone, carbon tetrabromide, tribromophenylsulfone, benzoyl peroxide, eosine, and methylene blue, and reducing agents, for instance, ascorbic acid, and triethanolamine. These photo-initiators may be used alone or in combination of two or more.

The heat-curable resins used herein, for instance, may include phenol-formalin resin, urea-formalin resin, melamine-formalin resin, phenol-furfural resin, furfural-acetone resin, furfuryl alcohol resin, xylene-formaldehyde resin, ketone-formaldehyde resin, alkyd resin, phenol resin, urethane resin, urea resin, epoxy resin, furfural resin, melamine resin, unsaturated polyester resin, triallyl cyanurate resin, acrolein resin, allyl resin, and heat-curable silicone resin as well as resins obtained by the copolymerization, and mixing of these resins.

By the term "ionizing radiation-disintegrating resin" used herein is intended a resin that can be cured upon irradiation with ionizing radiation, as in the case of the aforesaid ionizing radiation-curable resin. For instance, the ionizing radiation-disintegrating resin may comprise monomers such as methyl methacrylate, methyl isopropenyl ketone, tetrafluoropropyl methacrylate, hexafluorobutyl methacrylate, trichloroethyl methacrylate, and trichloro-α-chloroacrylate, and photo-initiators such as benzophenone, methyl o-benzoylbenzoate, and those mentioned above. Use may also be made of positive resists using naphthoquinonediazido compounds as a sensitizer and cresol novolak resin as a binder.

When the ionizing radiation-disintegrating resin is used for the concave pattern-forming material, the concave pattern 12 is first cured and formed on the transfer sheet in the same manner as in the case of the aforesaid ionizing radiation-curable resin. However, the concave pattern 12 is then transferred together with the ink layer 13 onto an associated substrate. Upon transfer onto the associated substrate, the pattern is exposed to ionizing radiation under such conditions as exemplified by an exposure of $1 \times 10^{-3}$ $C/cm^2$ and an acceleration voltage of 10 kV to 30 kV, or irradiated with electron beams according to a concave pattern to cut the main chain of the cured resin, so that the cured resin is soluble in a developer. Subsequently, the transferred concave pattern is removed by development to leave the ink layer alone. Alternatively, the transferred pattern may be removed by firing the associated substrate without being subjected to the development treatment.

The thermoplastic resin used herein, for instance, may include polymers or copolymers comprising at least one of methyl acrylate, methyl methacrylate, ethyl acrylate, ethyl methacrylate, n-propyl acrylate, n-propyl methacrylate, isopropyl acrylate, isopropyl methacrylate, sec-butyl acrylate, sec-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, hydroxyethyl acrylate, hydroxyethyl methacrylate, hydroxypropyl acrylate, hydroxypropyl methacrylate, styrene, α-methylstyrene, and N-vinyl-2-pyrrolidone; cellulose derivatives such as ethyl cellulose; and polybutene derivatives.

When the thermoplastic resin is used, it is preferable to incorporate therein a foaming agent optionally with a foaming promoter or foaming inhibitor. This is because it is possible to improve the ability of the concave pattern to be transferred onto, and released from, the intaglio by making use of the contraction of the concave pattern upon cooling.

For such a foaming agent it is preferable to use a decomposing type foaming agent that generates oxygen, carbonic acid, nitrogen and other gases upon decomposition at high temperatures, for instance, nitropentamethylenetetramine, diazoaminobenzene, azobisisobutyronitrile, and azodicarbonamide; a foamable microsphere such as a microballoon in which a low-boiling liquid such as butane, and pentane is microcapsulated with resin such as polyvinylidene chloride, and polyacrylonitrile; and a prefoamed microsphere such as a prefoamed microballoon. Among these, it is most preferable to use a foaming agent that can be foamed at relatively low temperatures, especially microballoons of various grades available from Matsumoto Yushi K.K., for instance. Preferably, the amount of the foaming agent or foamable microspheres is such that the factor of foaming of an air bubble-containing layer is within the range of about 1.5 to about 20.

The foaming conditions may vary depending on the softening point, plasticity upon foaming, and fluidity of the thermofoamable resin layer comprising thermoplastic resin, the foaming temperature of the foaming agent used, and the combination and ratio of the foaming promoters or foaming inhibitors added if required as well as on the cellular structure and shape of the foamable microspheres. For instance, when 0.1 to 20 parts by weight of the foaming agent azodicarbonamide are used per 50 to 75 parts by weight of polyvinyl chloride resin, it is preferable that a carboxylate composed mainly of lead, zinc, etc. is used as the foaming promoter, trimellitic anhydride is used as the foaming inhibitor, and heating is carried out at 180° C. to 210° C. for 1 to 3 minutes. For heating, warm air blowing, infrared irradiation, and dielectric heating may be used.

To improve the shape stability of the concave pattern, it is preferable to use shape-memory resin.

The ink may be filled in the intaglio or roll intaglio as mentioned just below. First, the aforesaid pattern-forming material is formed into ink. The ink is then filled in depressions in the intaglio by suitable means such as doctor blade coating, roll coating, air pressing, vacuum drawing, squeegeeing, doctoring or dipping, followed by removal of excessive ink portions by use of a scraper, film wiping, an air knife, etc. In any case, these coating processes may be carried out in combination with temperature control treatments for the purpose of increasing coating speed due to a viscosity drop, and ultrasonic treatments for the purpose of defoaming.

To improve the transferability of the concave pattern, it is preferable to provide a release layer on the intaglio surface or roll intaglio surface. For similar purposes, it is also preferable to incorporate a release agent in the concave pattern-forming material. The release agent used herein, for instance, may include waxes such as polyethylene wax, amide wax, Teflon powder, silicone wax, carnauba wax, acryl wax, and paraffin wax, fluorocarbon resins, melamine resins, polyolefin resins, ionizing radiation-curable type polyfunctional acrylate resins, polyester resins, epoxy resins, catalyst-, light-, and heat-curable silicone oils modified with amino, epoxy, OH, and COOH, and silicone resins. For the release layer it is preferable to have a thickness of 1 to 100 μm. When the release agent is incorporated in the concave pattern-forming material, it is preferable to use the release agent in an amount of about 0.01% by weight to about 10% by weight relative to the concave pattern-forming material.

It is here noted that the releasability of the concave pattern from the intaglio should preferably be determined while taking the adhesion of the concave pattern to the base film into account. For instance, when the concave pattern-forming material is formed of the ionizing radiation-curable resin, heat-curable resin, and thermoplastic resin, the concave pattern has preferably some adhesion to the base film because, as described later, it is required to transfer only the ink layer 13 onto the associated substrate 14. To this end it is preferable to provide an adhesive layer on the base film.

Figure 3:
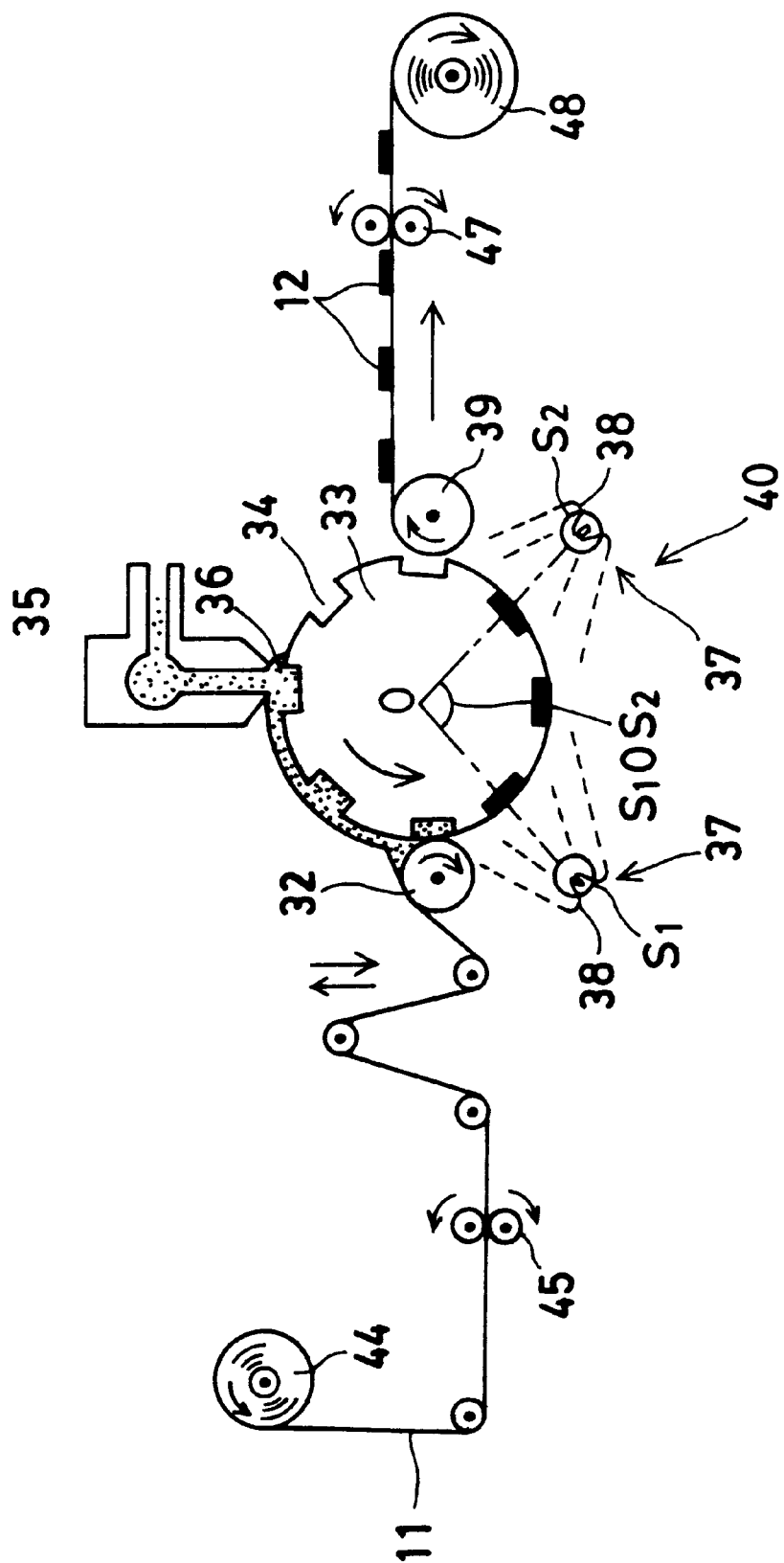
FIG. 3 is a schematic illustrative of how to use a roll intaglio to form a concave pattern on a base film.

One embodiment of the method of forming the concave pattern 12 is then explained with reference to FIG. 3 illustrative of how to form a concave pattern comprising a curable resin using a roll intaglio.

In FIG. 3, reference numeral 11 represents a base film, 12 a concave pattern, 33 a roll intaglio, 34 depressions, 35 a resin feeder, 36 a curable resin, 37 a curing device, 39 a release roll, 40 a coating section, 44 a feeding take-up roll, 45 feeder rolls, 47 compensator rolls, and 48 a receiving take-up roll.

A concave pattern-forming apparatus is built up of the feeding take-up roll 44 for feeding the base film 11, the feeder rolls 45, the compensator rolls 47, and the receiving take-up roll 48. The coating section 40 is built up of a press roll 32 for applying pressure on the base film 11, the roll intaglio 33 engraved with the depressions 34, the resin feeder 35 for coating the curable resin 36 (that is an uncured liquid at this time) onto the roll intaglio 33, the curing device 37 for curing and solidifying the liquid curable resin 36 filled in the depressions 34 in the roll intaglio 33, and the release roll 39.

At the coating section 40, pressure is so applied on the base film 11 by the press roll 32 that, at a position between the press roll 32 and the release roll 39, the base film 11 comes into close contact with the surface of the roll intaglio 33 with the curable resin 36 fed from the resin feeder sandwiched between them. The roll intaglio 33 is rotatably driven by a driving device (not shown) driven by an electric motor or the like in such a manner that the feeding speed of the base film 11 is synchronous with the peripheral speed of the roll intaglio 33. Between the roll intaglio 33 and the base film 11 in close contact with the roll intaglio 33 the curable resin 36 filled in the depressions 34 in the roll intaglio 33 is cured and solidified in an as-filled state by the curing device 37, so that the resin 36 is bonded onto the base film 11.

Following this, the base film 11 is released from the roll intaglio 33 by the release roll 39, so that the concave pattern 12 is formed on the base film 11.

The aforesaid press roll 32 may be any roll which can press the base film 11 onto the surface of the roll intaglio. More specifically, the press roll 32 has usually a diameter of about 50 mm to about 300 mm, and comprises a metal core covered therearound with silicone rubber, natural rubber or the like.

The curing device 37 may be selected from suitable devices depending on the type of the curable resin. However, it is preferable to use a device that can emit radiation such as electromagnetic waves, and charged particle beams having an energy quantum enough to crosslink and polymerize the curable resin. Industrially available radiation may include infrared rays, visible light, ultraviolet rays and electron beams as well as electromagnetic waves such as microwaves, and X-rays. In FIG. 3, reference numeral 38 represents a reflector for efficiently directing radiation emitted from a radiation source toward the roll intaglio. It is noted that two such curing devices 37 are provided per roll intaglio, and that radiation sources $S_1$ and $S_2$ for these two curing devices are positioned in such a manner that an angle $S_1OS_2$ between lines $S_1O$ and $S_2O$ where O is the center of the roll intaglio is within the range of 70° to 110°, and preferably 90°.

The roll intaglio 33 is preferably provided with the depressions 34 by suitable means such as electronic engraving, etching, milling, and electroforming, and is formed of metals such as copper, and iron having a chrome plated surface; ceramics such as glass, and quartz; and synthetic resins such as acryl resin, and silicone resin. Alternatively, a rolled sheet having a pattern of an ionizing radiation-curable resin, etc. formed on its outer surface may be used. Although not critical in size, the roll intaglio has usually a diameter of about 150 mm to about 1,000 mm and a line width of about 300 mm to about 2,000 mm. For the base film it is preferable to use a film that does not inhibit the arrival of radiation at the curable resin during curing.

In the practice of the present invention, it is noted that the curable resin may be fed directly to the roll intaglio by roll coating, as shown in FIG. 3. Alternatively, the curable resin may be fed directly to the roll intaglio from a suitable die such as a T-die. Still alternatively, the curable resin may have been roll-coated or otherwise coated on the base film substrate before the base film comes in contact with the roll intaglio.

Here an account is given of specific relations among the shape of the intaglio or roll intaglio used for transfer sheet fabrication, the shape of depressions in the transfer sheet, and the end pattern for PDPs or the like.

Figure 4A:
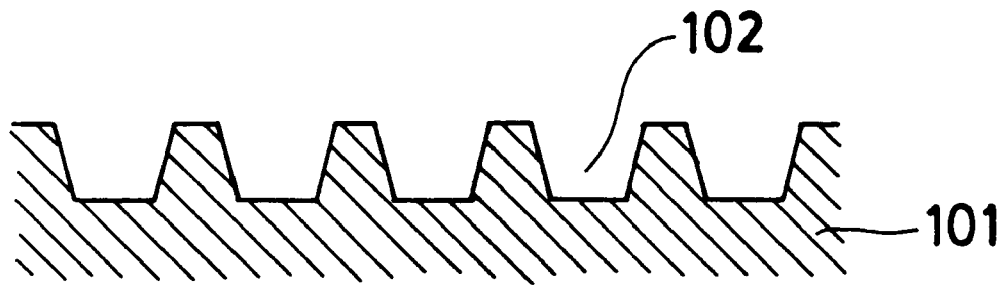
FIGS. 4(a), 4(b) and 4(c) are schematics illustrative of one relation among a roll intaglio, a transfer sheet and a shape of a pattern formed on an associated substrate.
Figure 4B:
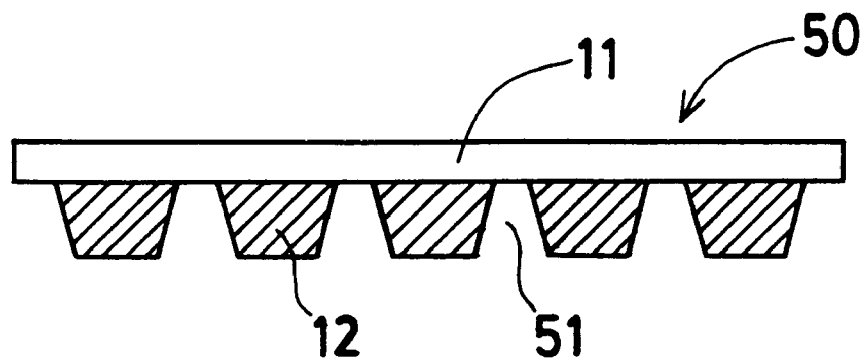
Figure 4C:
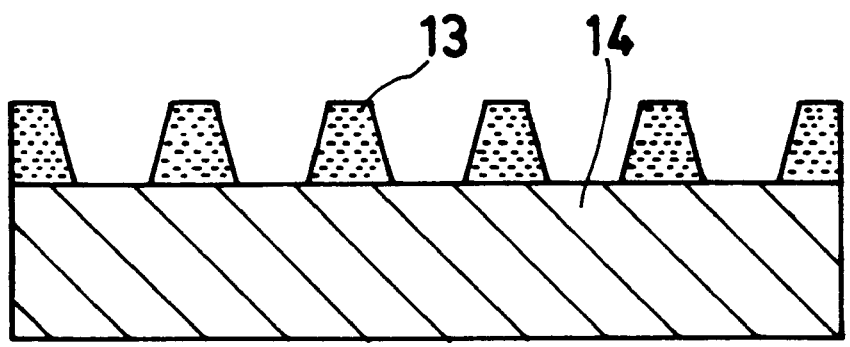

FIG. 4(*a*) illustrates depressions 102 in an intaglio 101, FIG. 4(*b*) shows depressions 51 in a transfer sheet 50 obtained using the intaglio shown in FIG. 4(*a*), and FIG. 4(*c*) depicts an ink layer 13 on an associated substrate 14 obtained using the transfer sheet shown in FIG. 4(*b*). The ink layer 13 provides the end pattern for PDPs or the like.

That is, the depressed spaces 102 in the intaglio are corresponding to the concave pattern 12 on the transfer sheet, while the depressed space 51 in the transfer sheet 50 are of the same shape as the ink layer 13 of the end pattern for PDPs or the like.

Besides the aforesaid forming method, the concave pattern may be formed on the base film by another method involving solid coating the base film with an ink comprising an ionizing radiation-curable resin (negative) and an ionizing radiation-disintegrating resin (positive), and then forming the concave pattern on the base film by means of lithography.

According to this method, an ink comprising an alkali development type of ionizing radiation-curable resin is solid coated on the base film, and a photomask is then used to cure an exposed portion. Following this, an unexposed portion is removed by development to form the concave pattern on the base film. When the ionizing radiation-disintegrating resin is used, an ink comprising the ionizing radiation-disintegrating resin is solid coated on the base film, and then exposed to light all over the surface to cure the resin. Then, a photomask is used to expose the cured resin to ionizing radiation under suitable disintegrating conditions, i.e., at an exposure of $1\times10^{-3}$ C/cm² and an acceleration voltage of 10 kV to 30 kV or to irradiate the cured resin with electron beams according to a concave pattern to cut the main chain of the cured resin at an exposed portion, so that the resin is soluble in a developer. Finally, the resin is removed by development to form the concave pattern.

Still another method may also be used, wherein the surface of the base film itself is embossed or etched, or formed or otherwise provided with a polymer film according to a concave pattern.

The first transfer sheet of the present invention will now be explained with reference to FIG. 2.

The base film 11 should neither be attacked by a solvent in the ink layer 13 nor be contracted or elongated by heat treatments in the process. To this end it is preferable to use films or sheets of polymer materials such as polyethylene terephthalate, 1,4-polycyclohexylenedimethylene terephthalate, polyethylene naphthalate, polyphenylene sulfide, polystyrene, polypropylene, polysulfone, Aramid, polycarbonate, polyvinyl alcohol, cellophane, cellulose derivatives represented by cellulose acetate, polyethylene, polyvinyl chloride, nylon, polyimide, and ionomer; sheets of metals such as aluminum, and copper; sheets of alloys such as Invar alloys (36Ni—Fe alloy, and 42Ni—Fe alloy); ceramic sheets of glasses, and inorganic materials; and composite sheets obtained from these sheets. In particular, it is preferable to use a multilayer sheet consisting of a polymer film and a ceramic sheet or a metal sheet having high heat distortion resistance as the composite sheet, because there is obtained a flexible sheet that has high mechanical strength and high heat distortion resistance.

It is also preferable to use a porous film through which gas passes but liquid (ink component) does not. When the pattern-forming material is filled in depressions in the concave pattern for transfer onto the associated substrate, it is then possible to improve the releasabillity of the pattern-forming material filled by feeding an amount of air through the back side of the base film, and hence the transferability of the ink layer. The base film has a thickness of 10 μm to 500 μm, and preferably 20 μm to 300 μm.

The shape of depressed spaces in the concave pattern 12 is commensurate with the electrode or barrier pattern to be fabricated. Depression depth is of the order of 5 μm to 50 μm when the concave pattern is used as an electrode pattern, 100 μm to 200 μm when used as a barrier pattern, 5 μm to 50 μm when used as a primer pattern, and 5 μm to 50 μm when used as a dielectric pattern.

The transfer sheet of the present invention may be not only in a flat sheet form as depicted in FIG. 2, but also in a roll form.

The ink layer 13, when used as a resistor or barrier layer just like a primer- or dielectric-forming layer in a PDP, is composed of an inorganic component comprising at least a glass frit and a resinous component that is to be removed by firing.

The glass frit used herein should preferably have a softening point of 350° C. to 650° C. and a coefficient of thermal expansion, $\alpha_{300}$, of $60\times10^{-7}/°$ C. to $100\times10^{-7}/°$ C. Exceeding the softening point of 650° C. is undesirable because firing must be carried out at elevated temperatures at which the glass frit tends to be thermally distorted. Falling below 350° C. is again undesirable because glass frits are fused together before the decomposition and volatilization of the resin, resulting in voids or other defects in the layer. Any deviation of the coefficient of thermal expansion from the range of $60\times10^{-7}/°$ C. to $100\times10^{-7}/°$ C. is not preferable because there is a large difference in the coefficient of thermal expansion between the ink layer and the glass substrate, which may otherwise result in distortion and other defects.

In addition to the glass frit, the inorganic component may contain a mixture of two or more inorganic powders and a mixture of two or more inorganic pigments.

The inorganic powder is an aggregate that is added if required. The inorganic powder is added to the inorganic component for the purpose of preventing casting and improving denseness upon firing, and has a softening point higher than that of the glass frit. For instance, it is possible to use inorganic powders such as aluminum oxide, boron oxide, silica, titanium oxide, magnesium oxide, calcium oxide, strontium oxide, barium oxide, and calcium carbonate powders, which have an average particle size of 0.1 μm to 20 μm. The inorganic powder is preferably used in an amount of 0 to 30 parts by weight per 100 parts by weight of the glass frit.

The inorganic pigment is added to the inorganic component, if required, for the purpose of preventing reflection of extraneous light, and improving practical contrast. For a dark color, it is preferable to use refractory dark pigments such as Co—Cr—Fe, Co—Mn—Fe, Co—Fe—Mn—Al, Co—Ni—Cr—Fe, Co—Ni—Mn—Cr—Fe, Co—Ni—Al—Cr—Fe, and Co—Mn—Al—Cr—Fe—Si. For a refractory white pigment it is preferable to use titanium oxide, aluminum oxide, silica, calcium carbonate or the like. The inorganic pigment is preferably used in an amount of 0 to 30 parts by weight per 100 parts by weight of the glass frit.

The resinous component to be removed by firing is added to the ink layer as a binder for the inorganic component, and for the purpose of improving the transferability of the ink layer. To this end a thermoplastic resin, an ionizing radiation-curable resin, a development type photosensitive resin, etc. may be used.

The thermoplastic resin used herein may be those referred to in connection with the aforesaid concave pattern-forming material. However, it is preferable to use polymers or copolymers comprising at least one of methyl acrylate, methyl methacrylate, ethyl acrylate, ethyl methacrylate, n-propyl acrylate, n-propyl methacrylate, isopropyl acrylate, isopropyl methacrylate, n-butyl methacrylate, n-butyl acrylate, sec-butyl acrylate, sec-butyl methacrylate, isobutyl acrylate, isobutyl methacrylate, tert-butyl acrylate, tert-butyl methacrylate, hydroxyethyl acrylate, hydroxyethyl methacrylate, hydroxypropyl acrylate, hydroxypropyl methacrylate, 2-ethylhexyl methacrylate, and 2-ethylhexyl acrylate, ethyl cellulose, and polybutene derivatives.

The ionizing radiation-curable resin used herein may be such ultraviolet or electron beam-curable resins as referred to in connection with the aforesaid concave pattern 12. That is, it is possible to use compositions comprising suitable mixtures of prepolymers, oligomers and/or monomers having a polymerizable unsaturated bond or epoxy group in their molecule.

The resinous component such as the thermoplastic resin and ionizing radiation-curable resin is used in an amount of 3 parts by weight to 50 parts by weight, preferably 5 parts by weight to 30 parts by weight per 100 parts by weight of the inorganic component. When the resinous component is less than 3 parts by weight, the retention of pattern shape becomes worse, posing a problem that it is difficult to fabricate PDPs, etc. More than 50 parts by weight of the resin are undesirable because carbon remains in the layer upon firing, resulting in a quality drop.

If required, plasticizers, viscosity increasers, dispersants, suspending agents, defoaming agents, release agents, leveling agents, etc. may be added to the resinous component.

As the resinous component to be removed by firing, it is also preferable to use a development type photosensitive resin.

The development type photosensitive resin comprises a binder polymer and a polymerizable monomer, and may contain photo-initiators, sensitizers, short-stops and chain transfer agents as well as plasticizers, dispersants, suspending agents, defoaming agents, release agents, leveling agents, etc., if required.

For the binder polymer it is preferable to use copolymers comprising at least one of methyl acrylate, methyl methacrylate, ethyl acrylate, ethyl methacrylate, n-propyl acrylate, n-propyl methacrylate, isopropyl acrylate, isopropyl methacrylate, sec-butyl acrylate, sec-butyl methacrylate, n-butyl acrylate, n-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, styrene, α-methylstyrene, and N-vinyl-pyrrolidone. Mixtures of two or more such copolymers, and polymers obtained by adding ethylenically unsaturated compounds to such copolymers may also be used. These polymers have a weight-average molecular weight of 5,000 to 300,000, and preferably 10,000 to 200,000.

The polymerizable monomer and photo-initiator used herein may be those referred to in connection with the aforesaid concave pattern 12. The polymerizable monomer is preferably used in an amount of 20 parts by weight to 200 parts by weight per 100 parts by weight of the binder polymer, and the photosensitive resin, when it is of the negative type, is preferably used in an amount of 2 parts by weight to 60 parts by weight, preferably 2 parts by weight to 30 parts by weight per 100 parts by weight of the total inorganic component. More than 60 parts by weight of the photosensitive resin are undesirable because carbon remains in the layer upon firing, resulting in a quality drop.

The plasticizer is added for the purpose of improving the transferability and fluidity of the ink, and may include n-alkyl phthalates such as dimethyl phthalate, dibutyl phthalate, and di-n-octyl phthalate; phthalic acid esters such as di-2-ethylhexyl phthalate, diisodecyl phthalate, butylbenzyl phthalate, diisononyl phthalate, ethylphthalethyl glycolate, and butylphthalylbutyl glycolate; trimellitic acid esters such as tri-2-ethylhexyl trimellitate, tri-n-alkyl trimellitate, triisononyl trimellitate, and triisodecyl trimellitate; aliphatic dibasic acid esters such as dimethyl adipate, dibutyl adipate, di-2-ethylhexyl adipate, diisodecyl adipate, dibutyl diglycol adipate, di-2-ethylhexyl azelate, dimethyl sebacate, dibutyl sebacate, di-2-ethylhexyl sebacate, di-2-ethylhexyl maleate, acetyl-tri-(2-ethyl-hexyl)citrate, acetyl-tri-n-butyl citrate, and acetyl tributyl citrate; glycol derivatives such as polyethylene glycol benzoate, triethylene glycol-di-(2-ethylhexoate), and polyglycol ether; glycerin derivatives such as glycerol triacetate, and glycerol diacetyl monolaurate; polyesters comprising sebacic acid, adipic acid, azelaic acid, and phthalic acid; low-molecular-weight polyethers having a molecular weight of 300 to 3,000; low-molecular-weight poly-α-styrenes having the same molecular weight as mentioned above; low-molecular-weight polystyrenes having the same molecular weigh as mentioned above; orthophosphates such as trimethyl phosphate, triethyl phosphate, tributyl phosphate, tri-2-ethylhexyl phosphate, tributoxyethyl phosphate, triphenyl phosphate, tricresyl phosphate, trixylenyl phosphate, cresyl diphenyl phosphate, xylenyl diphenyl phosphate, and 2-ethylhexyl diphenyl phosphate; ricinoleic acid esters such as methyl acetyl ricinoleate; polyester-epoxidized esters such as poly-1,3-butanediol adipate, and epoxidized soybean oil; and acetic acid esters such as glycerin triacetate, and 2-ethylhexyl acetate.

The viscosity increaser is added, if required, for the purpose of increasing the viscosity of the ink. Known viscosity increasers may be used to this end, but it is preferable to use hydroxyethyl cellulose, methyl cellulose, carboxymethyl cellulose, soda alginate, casein, soda caseinate, xanthane gum, polyvinyl alcohol, urethane-modified polyether, polacrylic acid ester, polymethacrylic acid ester, montmorillonite, aluminum stearate, zinc stearate, aluminum octylic acid ester, hydrogenated castor oil, castor oil ester, fatty amide, polyethylene oxide, dextrin fatty acid ester, dibenzylidene sorbitol, vegetable oil base polymerized oil, surface treated calcium carbonate, organic bentonite, silica, titania, zirconia, and alumina, the latter seven being in a finely divided form.

The dispersant and suspending agent are used for the purpose of improving the dispersibility and suspending property of the inorganic component. For instance, phosphoric ester base agents, silicone base agents, castor oil ester base agents, and various surfactants are used to this end. The defoaming agent used herein, for instance, includes silicone base agents, acryl base agents, and various surfactants. The release agent used herein, for instance, includes silicone base agents, fluorinated oil base agents, paraffin base agents, fatty acid base agents, castor oil base agents, wax base agents, and compound base agents, while the leveling agent used herein, for instance, includes fluorine base agents, silicone base agents, and various surfactants. These agents may be used in suitable amounts.

For ink preparation, the aforesaid ink materials may be dissolved or dispersed in methanol, ethanol, isopropanol, acetone, methyl ethyl ketone, toluene, xylene, cyclohexanones such as cyclohexanone, methylene chloride, 3-methoxybutyl acetate, ethylene glycol monoalkyl ethers, ethylene glycol alkyl ether acetates, diethylene glycol monoalkyl ethers, diethylene glycol monoalkyl ether acetates, propylene glycol monoalkyl ethers, propylene glycol monoalkyl ether acetates, dipropylene glycol monoalkyl ethers, dipropylene glycol monoalkyl ether acetates, and terpenes such as α- or β-terpineol. In the practice of the present invention, it is also preferable to use a non-solvent type ink free from such solvents.

The ink layer, when it is used for the formation of an electrode, is composed of an inorganic component comprising at least a glass frit, a resinous component that is to be removed by firing, and an electroconductive powder.

The inorganic component used herein includes the glass frit, inorganic powder and inorganic pigment already mentioned in connection with the ink layer for a barrier layer, etc. The inorganic powder is preferably used in an amount of 0 to 10 parts by weight per 100 parts by weight of the glass frit.

The resinous component used herein may be those already referred to in connection with the ink layer for a barrier layer, etc. The content of the resinous component to be removed by firing in the electrode layer-forming ink is 3% by weight to 60% by weight, and preferably 5% by weight to 30% by weight.

For the electroconductive powder it is preferable to use spherical powders of metals such as gold, silver, copper, nickel, and aluminum, which have an average particle size of 0.1 μm to 5 μm. The glass frit is used in an amount of 2 parts by weight to 20 parts by weight per 100 parts by weight of the electroconductive powder.

If necessary, the electrode layer-forming ink may further contain plasticizers, dispersants, suspending agents, defoaming agents, release agents, and leveling agents. The agents already referred to in connection with the formation of a barrier layer, etc. may all be used to this end. To prepare an ink for forming the electrode layer, the aforesaid ingredients are mixed with the solvent already mentioned in connection with the formation of a dielectric layer, etc., if required, and the mixture is then kneaded by means of a roll mill, a bead mill, etc. to form an ink form of coating solution or kneaded by means of a ball mill, etc. to form a slurried form of coating solution.

The ink layer for the concave pattern may be constructed in the form of a multilayer structure comprising two or more layers containing pigments of different colors. For instance, a dark ink layer is first stacked on the bottom of the concave pattern, and a white ink layer is then stacked on the dark ink layer to form a double-layer structure comprising dark and white ink layers for the pattern for the formation of a barrier layer. Alternatively, a transparent layer is first stacked on the bottom of the concave pattern, after which dark, and white ink layers are stacked on the transparent ink layer in the described order to form a triple-layer structure. Upon this ink multilayer structure transferred onto an associated substrate, there is obtained a barrier-forming layer comprising the dark layer stacked on the white color, as viewed from the PDP substrate. Consequently, the contrast of the PDP is improved because the observation side of the barrier is of a dark color.

A similar multilayer structure may also be obtained by providing an electroconductive ink layer on the bottom of the concave pattern for an electrode-forming pattern, and then stacking an dark ink layer on the electroconductive layer. In this case, too, the side of the multilayer structure to be observed has a dark color, and so the contrast of a PDP using such structure is improved as in the case of a barrier-forming layer. The dark ink layer may be a non-electroconductive ink layer comprising a glass frit, an inorganic powder, a dark inorganic pigment and a resinous component to be removed by firing, as in the case of the aforesaid ink for the barrier-forming layer. However, it is preferable to use an electroconductive ink layer containing an electroconductive powder in place of the inorganic powder. Preferably in this case, the dark pigment mentioned in connection with the aforesaid ink layer for a barrier-forming layer is used in an amount of 2 parts by weight to 700 parts by weight per 100 parts by weight of the glass frit.

To improve the transferability of the ink layer 13, it is preferable to provide a release layer on the surface of the concave pattern 12. For similar purposes, it is also preferable to incorporate a release agent in the concave pattern-forming material or the material forming the ink layer 13.

The release agent used herein, for instance, may include waxes such as polyethylene wax, amide wax, Teflon powder, silicone wax, carnauba wax, acryl wax, and paraffin wax, fluorocarbon resins, melamine resins, polyolefin resins, ionizing radiation-curable type polyfunctional acrylate resins, polyester resins, epoxy resins, catalyst-, light-, and heat-curable silicone oils modified with amino, epoxy, OH, and COOH, and silicone resins. Preferably in this case, the release agent is contained in an amount of 0.01% by weight to 10% by weight in the concave pattern 12 or the ink layer 13. A release layer, when it is provided on the surface of the concave pattern, has a thickness of 0.1 $\mu$m to 50 $\mu$m, preferably 1 $\mu$m to 10 $\mu$m.

To improve the transferability of the ink layer 13, it is also preferable to make use of the contraction of the ink layer upon cooling. By making the degree of contraction upon cooling of the concave pattern-forming material different from that of the ink layer material so that the ink layer can be brought up to high temperatures upon filling, and then cooled upon transfer, it is possible to improve the releasability and transferability of the ink layer. When the ink layer comprises a thermoplastic resin, it is preferable to add thereto the foaming agent or foamable sphere mentioned in connection with the formation of the aforesaid concave pattern because the contraction thereof upon cooling can be utilized to improve the releasability thereof.

The ink may be filled in the concave pattern on the transfer sheet as mentioned just below. The ink is filled in concave pattern by suitable means such as doctor blade coating, roll coating, air pressing, vacuum drawing, squeegeeing, doctoring or dipping, followed by removal of excessive ink portions by use of a scraper, film wiping, an air knife, etc. In any case, these coating processes may be carried out in combination with temperature control treatments for the purpose of increasing coating speed due to a viscosity drop, and ultrasonic treatments for the purpose of defoaming.

When a non-solvent or solvent-free type ink is used for the ink layer 13, for instance, when the ink layer 13 is used as a barrier-forming layer or dielectric-forming layer, solid powders comprising glass frit, inorganic powder or pigment and an organic component or only inorganic component powders comprising glass frit are forced into the concave pattern on the base film while they are in an as-powder form or in a suitably wetted state, using a die or vacuum drawing. When the ink layer 13 is used as an electrode-forming layer, powders comprising electroconductive metal powder and glass frit are similarly forced in the concave pattern on the base film.

To improve the transferability of such a non-solvent type ink layer, it is preferable to incorporate a release agent in the concave pattern or subject the surface of the concave pattern to release treatment. For transfer, pressure may be applied on the back side of the base film to force the ink layer out of the concave pattern. In the practice of the present invention, however, it is preferable to heat the ink layer to a temperature (yielding point) at which the glass frit component is partially softened so that the contraction of the ink layer is utilized for transfer. It is also preferable to form the concave pattern of an ionizing radiation-disintegrating resin. In this case, the concave pattern is first transferred together with the ink layer onto an associated substrate, and then irradiated with ionizing radiation to make the resin soluble in a developer so that it can be removed by development. Alternatively, the resin may be removed by firing for PDP fabrication.

The first pattern-forming method of the present invention will now be explained.

Figure 5A:
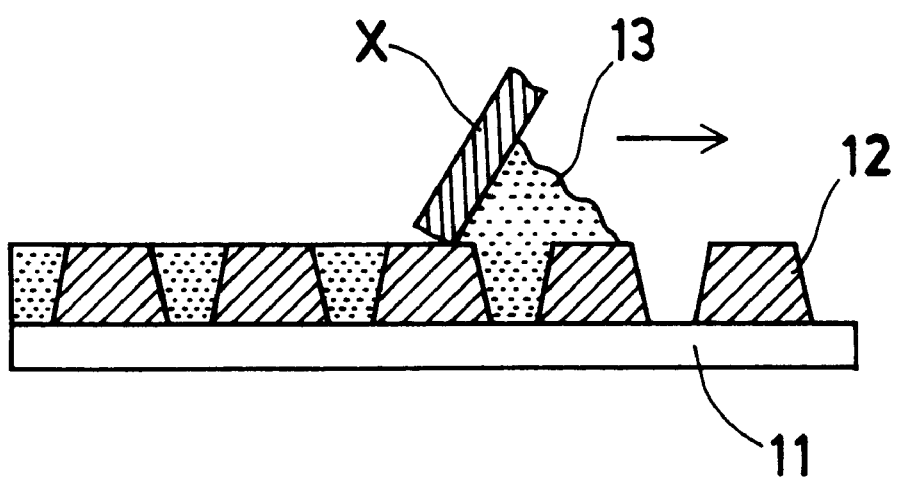
FIGS. 5(a) and 5(b) are schematics of illustrative of one embodiment of the first pattern-forming method according to the present invention.
Figure 5B:
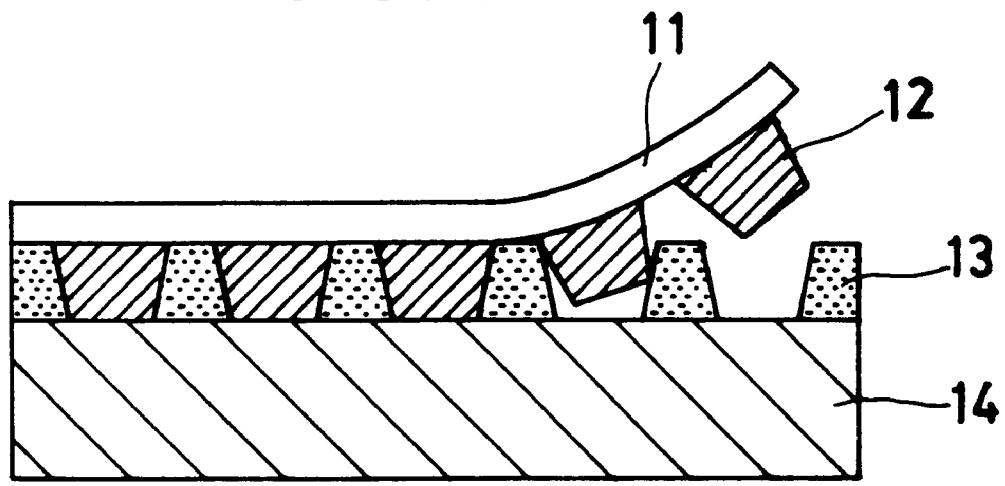

FIG. 5 illustrates an embodiment of the present invention wherein only an ink layer 13 is transferred onto an associated substrate. A base film 11, in which the ink layer 13 is filled using a squeegee X as depicted in FIG. 5(a), is laminated on an associated substrate 14. Then, pressure is applied on the back surface of the base film 11 to release a concave pattern 12 from the base film 11 so that, as depicted in FIG. 5(b), the ink layer 13 alone is transferred onto the associated substrate 14.

The application of pressure on the transfer sheet and the associated substrate 14 may be achieved by use of flat pressing, roll pressing, adsorption porous roll pressing, arc pressing, etc. The flat pressing process uses a flat pressing plate for easy alignment, and so is the arc pressing process. According to the roll pressing process, while the roll is being rotated, pressure is applied from the back side of the transfer sheet on the released transfer sheet and the associated substrate to transfer the ink layer 13 onto the associated substrate, followed by separation of the base film (transfer sheet). Thus, this roll pressing process has a merit of being excellent in processability, but has a demerit of rendering it difficult to align patterns with each other due to an elongation of the transfer sheet. For instance, it is important for transfer to precisely align a barrier pattern on the transfer sheet with an electrode pattern on the associated substrate.

The adsorption porous roll pressing process is superior to the aforesaid pressing processes in terms of processability and prevention of elongation of the transfer sheet. The adsorption porous roll pressing process uses a porous roll having discrete adsorption areas for adsorbing the back side of the transfer sheet, so that the transfer sheet can be intermittently adsorbed by such discrete adsorption areas. While the porous roll is being rotated, pressure is applied from the back side of the transfer sheet on the released transfer sheet and the associated substrate to transfer the ink layer 13 onto the associated substrate. After transfer, the base film is released from the transfer sheet while the transfer sheet is pressed onto the adsorption roll to make the transfer sheet free from tension (put the transfer sheet in a tension-free state), thereby preventing elongation of the pattern.

To make the transfer sheet completely free from tension, the transfer sheet may be cut conforming to the size of an associated substrate to achieve a so-called "sheet transfer" with the flat or arc pressing process. To make the transfer sheet completely free from tension, it is also preferable to apply a metal film on the back side of the transfer sheet. With this technique, it is possible to eliminate the problems with the aforesaid roll pressing process, and so achieve excellent processability because the transfer sheet can be made in an endless form. It is noted that when the concave pattern is formed on the transfer sheet having a metal film applied on its back side, it is possible to precisely align the concave pattern with the base film.

When the resinous component in the ink layer is a thermoplastic resin, the ink layer alone can be transferred onto the associated substrate by heat pressing wherein the aforesaid transfer processes are carried out in combination with some suitable means such as heat roll or heat press. To improve the transferability of the ink layer, it is also preferable to treat the ink layer with a solvent to impart tackiness to the ink layer for so-called "wet transfer". If required, this "wet transfer" is used in combination with heat pressing.

When the resinous component in the ink layer is an ionizing radiation-curable resin, a development type photosensitive resin or a heat-curable resin, transfer may be carried out in combination with suitable curing means for ultraviolet rays, infrared light, laser light, electron beams, and other ionizing radiation. Alternatively, transfer may be followed by curing.

FIG. 6 illustrates some embodiments of the concave shape on the transfer sheet and pattern shape obtained on the substrate.

Figure 6A:
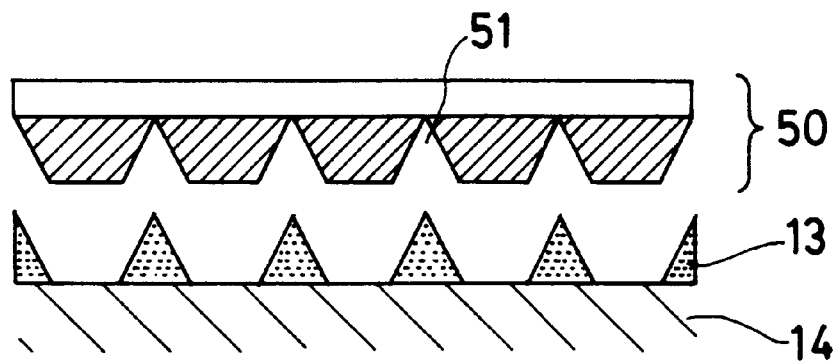
FIGS. 6(a), 6(b) and 6(c) are schematics illustrative of another relation between a shape of depressions in a transfer sheet and a shape of a pattern obtained on an associated substrate.
Figure 6B:
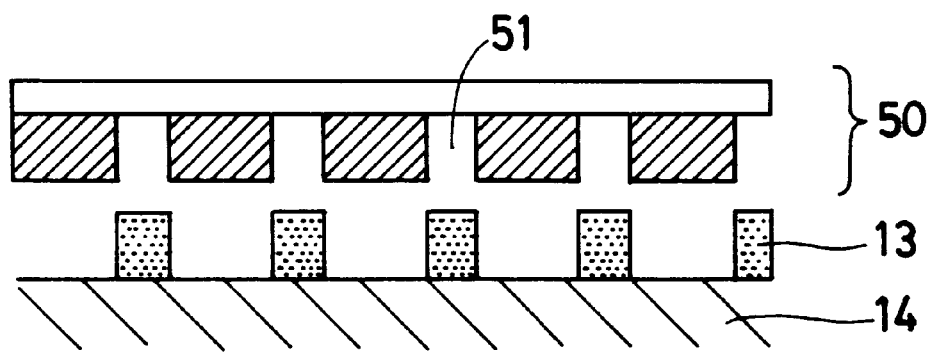
Figure 6C:
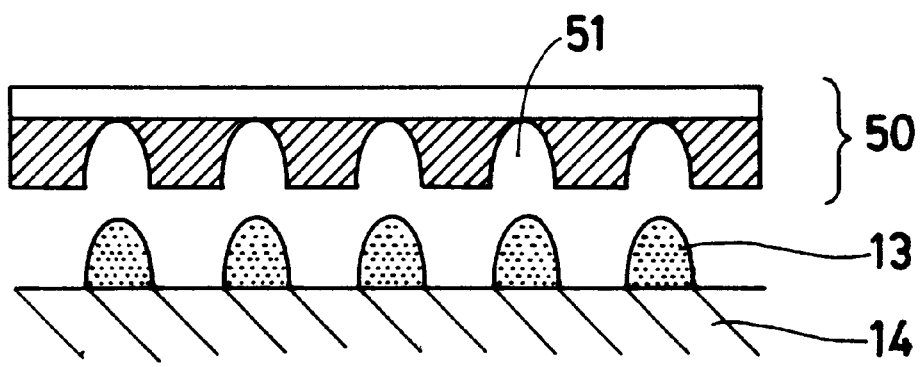

Patterns obtained using the transfer sheet of the present invention have, in addition to an array of discrete trapezoids as shown in FIG. 5, an array of discrete triangles as depicted in FIG. 6(a), an array of discrete cuboids as depicted in FIG. 6(b), and an array of discrete hemispheres as depicted in FIG. 6(c). For instance, a PDP cell may be made convex, e.g., hemi-elliptic on its front plate side. It is noted that in the PDP cell such a section defines one side of the cell surrounded with four sides, e.g., defines a longitudinal section shape of a barrier layer irrespective of the plane shape of the cell.

Figure 7:
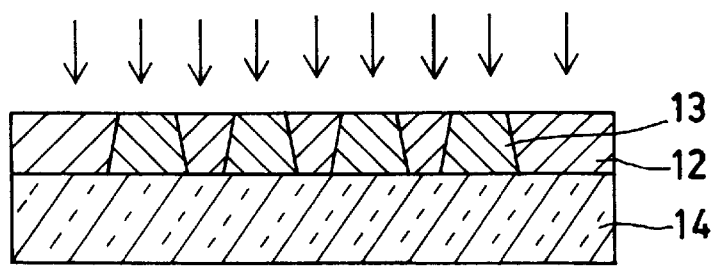
FIG. 7 is a schematic illustrative of a transfer process used when an ionizing radiation-disintegrating resin is used as a concave pattern-forming material.

When the concave pattern 12 comprises an ionizing radiation-disintegrating resin, both the concave pattern 12 and ink layer 13 are transferred onto an associated substrate 14, and only a base film 11 having no concave pattern 12 is then released from the associated substrate 14. As the associated substrate 14 having both the concave pattern 12 and ink layer 13 transferred onto it is irradiated with ionizing radiation, as depicted in FIG. 7, the concave pattern is soluble in a developer so that it can be dissolved and removed by development to leave only the ink layer 13 on the associated substrate.

The associated substrate 14 is a glass substrate or glass material having a primer layer when the pattern is an electrode layer on a PDP element. When the pattern is a barrier layer on a PDP element, the associated substrate 14 is a multilayer structure comprising a glass substrate having, or having not, a primer layer and only an electrode layer stacked thereon, or an electrode layer and a dielectric layer successively stacked thereon.

When pattern transfer is carried out using the first transfer sheet of the present invention, it is preferable to repeat filling and transfer processes in the same pattern to obtain a desired thickness.

The pattern-forming method using the first transfer sheet of the present invention is particularly suitable for the formation of ultrafine patterns for electrode layers, barrier layers, etc., and enables such ultrafine patterns to be fabricated in improved yields for a reduced time of period. It is also possible to obtain patterns which are excellent in surface smoothness, have a uniform thickness, and are of good profile precision.

The ink layer is pattern-wise transferred onto the associated substrate, followed by firing at a temperature of 350° C. to 650° C. at which the organic component in the ink layer is gasified, decomposed and volatilized off, whereby the inorganic powders are intimately bonded together by molten glass frits. Thus, an electrode layer, a barrier layer, a primer layer, or a dielectric layer is formed by firing.

Figure 8:
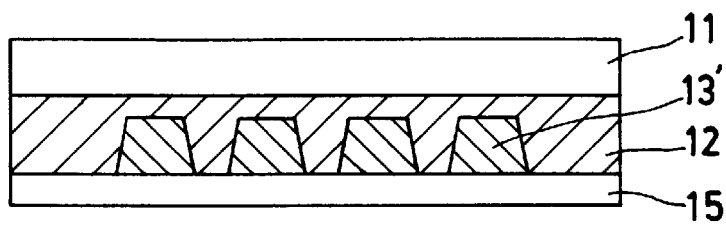
FIG. 8 is a sectional schematic illustrative of the second transfer sheet according to the present invention.
Figure 9:
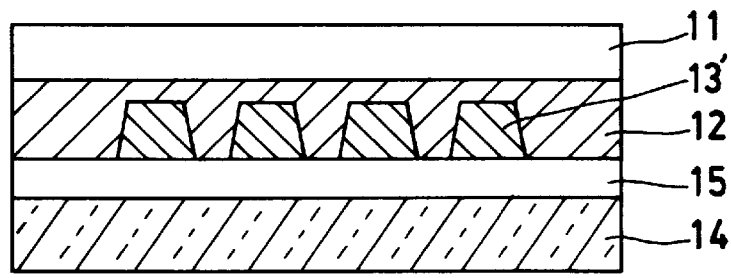
FIG. 9 is a schematic illustrative of the second pattern-forming method according to the present invention.
Figure 10:
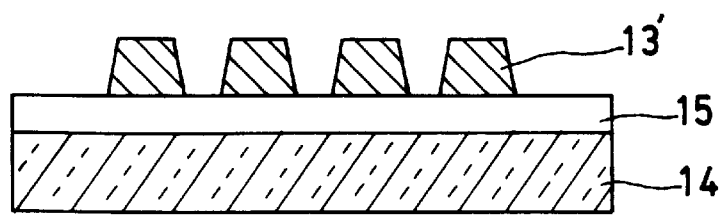
FIG. 10 is a schematic illustrative of one state of a pattern transferred onto an associated substrate using the second transfer sheet according to the present invention.

The second transfer sheet of the present invention will now be explained. FIG. 8 is a sectional view of the second transfer sheet of the present invention, and FIGS. 9 and 10 are schematics illustrative of the second pattern-forming method of the present invention. Throughout FIGS. 8 to 10, reference numeral 13' stands for a first ink layer, and 15 a second ink layer, and the same numerals as in FIG. 5 indicate the same parts.

In the second transfer sheet of the present invention, the first ink layer 13' composed of an inorganic component comprising at least a glass frit and a resinous component that is to be removed by firing is filled in depressions in the base film 11 having a concave pattern 12 formed on one side thereof, and the second ink layer 15 composed of an inorganic component comprising at least a glass frit and a resinous component that is to be removed by firing is stacked on the first ink layer 13'.

For the transfer sheet for PDP fabrication, (1) the ink layer is used as an electrode-forming layer while the second ink layer is used as a primer-forming layer, and (2) the first ink layer is used as a barrier-forming layer while the second ink layer is used as a dielectric-forming layer. The first and second ink layers can simultaneously be transferred onto an associated substrate 14. The materials of which the respective layers are formed are the same as mentioned in connection with the first transfer sheet. When a dark ink layer is used as a layer to be filled in the concave pattern to form a barrier-forming layer, it is again possible to obtain a PDP of high contrast.

The second ink layer 15 is stacked on the concave pattern 12 filled with the first ink layer in a form conforming to the pattern for the primer or dielectric layer. The second ink layer is coated on the concave pattern 12 with the first ink layer filled in its depressions, using screen printing, etc. In the process wherein the first ink or the barrier-forming layer is filled in the concave pattern, however, voids are formed in the first ink due to a volume decrease upon drying. With this process a dielectric-forming material can be filled in such voids so that the barrier-forming layer can be formed with higher precision. It is also preferable to use a transfer sheet formed by coating the second ink layer on another film to transfer the second ink layer onto the concave pattern 12 with the first ink layer filled in its depressions. Furthermore, it is possible to use the second ink layer comprising a photosensitive resin such as an ionizing radiation-curable or disintegrating resin for pattern formation. For instance, an ink comprising an alkali-development type photosensitive resin may be solid coated on the concave pattern 12, followed by pattern-wise exposure using a photomask, and development.

The second ink layer, when it is used as the primer-forming layer, has a thickness of 5 $\mu$m to 50 $\mu$m, and when it is used as the dielectric-forming layer, has a thickness of 5 $\mu$m to 50 $\mu$m.

According to the second pattern-forming method of the present invention, the first and second ink layers are simultaneously transferred onto the associated substrate 14 while the second transfer sheet is superposed on the associated substrate 14. The transfer process used herein is the same as that used for the first pattern-forming method already mentioned.

To improve the transferability of the ink layers onto the associated substrate, it is preferable to provide an adhesive layer on the second layer ink, if required. The adhesive may be any of the aforesaid thermoplastic resins that can be removed by firing or combinations of such thermoplastic resin with plasticizers, reactive monomers, etc.

After transfer, the substrate may be fired into a PDP as in the case of using the first transfer sheet.

When an ink layer is filled in the concave pattern, the transferability of the ink layer becomes worse in an as-dried or as-solidified state because the surface of the filled ink layer is lower than the surface of the base film. This phenomenon is particularly noticeable in the case where the ink layer, for instance, provides a barrier-forming layer having a large thickness. The second transfer, and pattern-forming method of the present invention, however, has a merit of being improved in transferability because the area of contact of the ink layer with the associated substrate becomes large due to the provision of the ink layer on the concave pattern.

The use of the second transfer sheet contributes to an improvement in processability because a plurality of layers can be simultaneously formed by transfer, and enables a PDP to be fabricated with high alignment precision because inter-layer alignment can be carried out at the stage of the transfer sheet.

Figure 11:
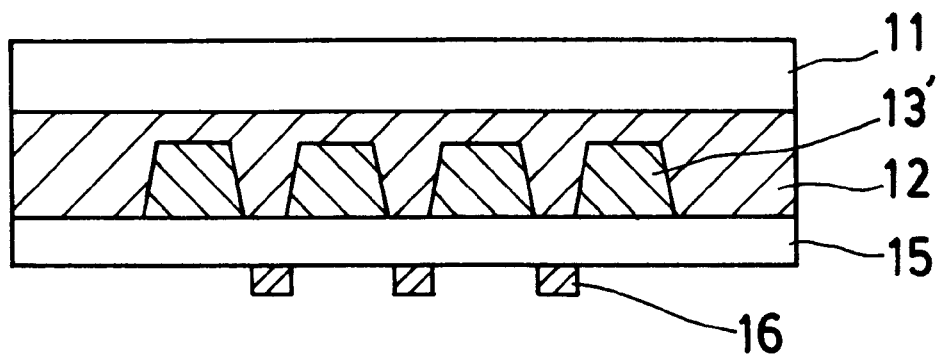
FIG. 11 is a sectional schematic illustrative of the third transfer sheet according to the present invention.
Figure 12:
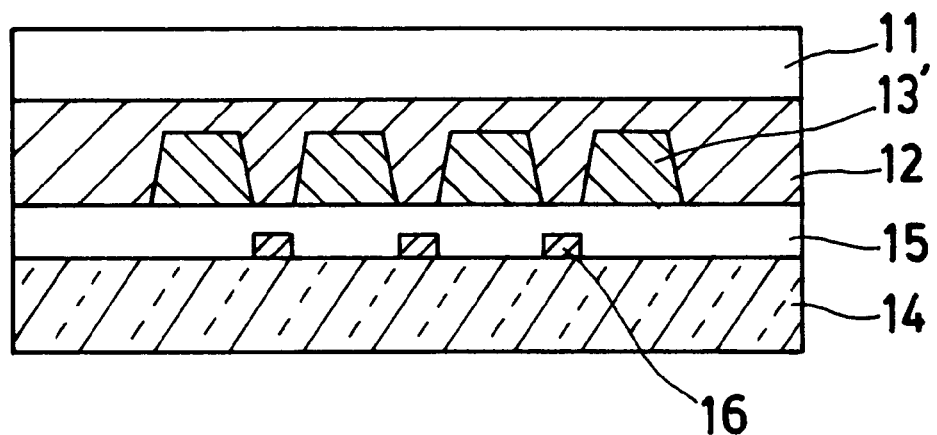
FIG. 12 is a schematic illustrative of the third pattern-forming method according to the present invention.
Figure 13:
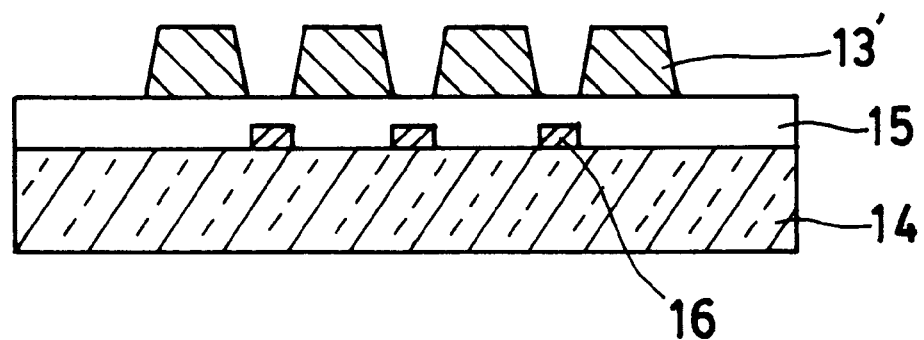
FIG. 13 is a schematic illustrative of one state of a pattern transferred onto an associated substrate using the third transfer sheet according to the present invention.

The third transfer sheet of the present invention will now be explained. FIG. 11 is a sectional schematic of the third transfer sheet of the present invention, and FIGS. 12 and 13 are schematics illustrative of the third pattern-forming method of the present invention. Throughout FIGS. 11 to 13 reference numeral 16 stands for a third ink layer, and the same numerals as in FIGS. 5 and 8 represent the same parts.

In the third transfer sheet of the present invention, a first ink layer 13' composed of an inorganic component comprising at least a glass frit and a resinous component that is to be removed by firing is filled in depressions in a base film 11 having a concave pattern 12 formed on one side thereof, a second ink layer 15 composed of an inorganic component comprising at least a glass frit and a resinous component that is to be removed by firing is stacked on the concave patter 12 with the first ink layer 13' filled therein, and the third ink layer 16 is stacked on the second ink layer 15.

For a transfer sheet for PDP fabrication, the first ink layer provides a barrier-forming layer, the second ink layer a dielectric-forming layer, and the third ink layer an electrode-forming layer. The first, second and third ink layers can be simultaneously transferred onto an associated substrate 14.

Materials of which the respective layers are formed may be the same as described in connection with aforesaid first transfer sheet. In this embodiment, however, the second and third ink layers are successively stacked on the concave pattern 12 with the first ink layer filled therein, conforming to forms corresponding to the patterns for the dielectric and electrode layers.

The second and third ink layers may be successively stacked on the concave pattern 12 with the first ink layer filled therein by means of either screen printing or transfer. The second and third ink layer may be each composed of a photosensitive resin such as an ionizing radiation-curable or disintegrating resin. In this case, they are solid coated on the concave pattern 12, followed by pattern-wise exposure using a photomask, and development.

Figure 14A:
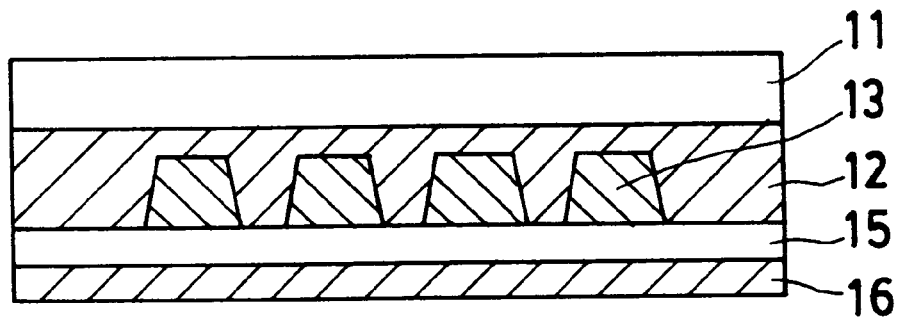
FIGS. 14(a), 14(b) and 14(c) are schematics illustrative of one embodiment of how to fabricate the third transfer sheet according to the present invention.
Figure 14B:
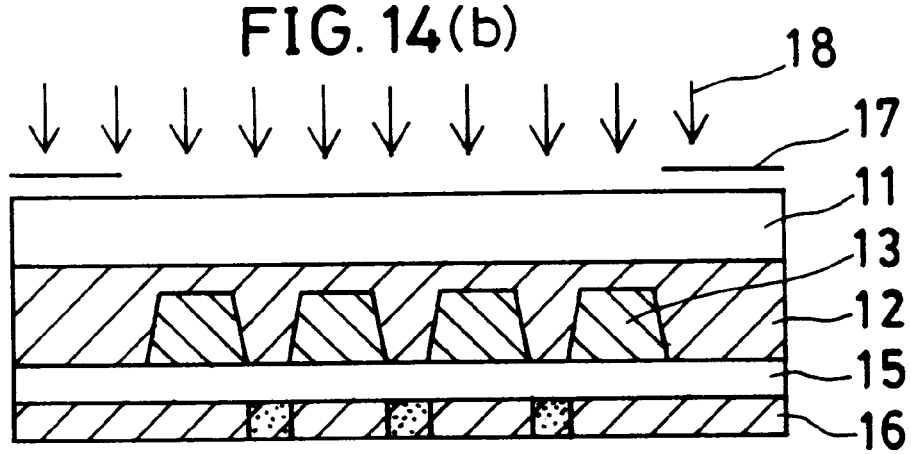
Figure 14C:
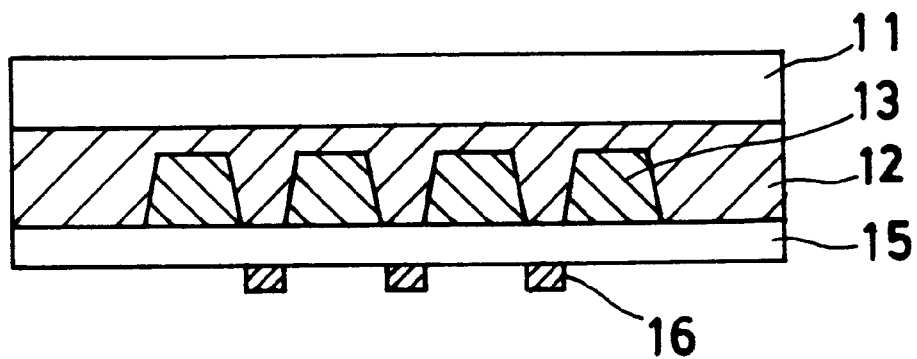

When the third ink layer is used as an electrode-forming layer, the first and second ink layers are formed as barrier- and dielectric-forming layers, respectively. Then, an electrode-forming coating solution comprising an alkali-development type photosensitive resin may be solid coated on the second ink layer to form an electrode pattern by exposure using a photomask, and development. As depicted in FIG. 14, the first ink layer 13 may be formed as a barrier-forming layer comprising a dark ink layer, and the second ink layer 15 may be formed in the form of a dielectric-forming layer. Then, an electrode-forming coating solution comprising an alkali-development type photosensitive resin is solid coated in the form of the third ink layer 16, and exposed to light from the side of the base film 11 using a photomask 17 and developed so that, as depicted in FIG. 14(c), an electrode pattern 16 can be formed while the dark ink layer acts as a mask. This process is preferable because the barrier pattern can be precisely aligned with the electrode pattern. The second ink layer, when it is used as the electrode-forming layer, has a thickness of 5 $\mu$m to 50 $\mu$m, and the third ink layer, when it is used as the electrode-forming layer, has a thickness of 5 $\mu$m to 50 $\mu$m.

It is here noted that after the third ink layer is formed as the electrode-forming layer in an electrode pattern-wise manner, a primer-forming layer may be stacked on the electrode pattern at a thickness of 5 $\mu$m to 50 $\mu$m, if required.

According to the third pattern-forming method of the present invention, the first, second and third ink layers are simultaneously transferred onto the associated substrate 14 with the third transfer sheet superposed on the associated substrate 14. The transfer process used to this end may be the same as described in connection with the first pattern-forming method. To improve the transferability of the ink layers onto the associated substrate, it is preferable to provide the aforesaid adhesive layer on the third ink layer or the primer-forming layer, if necessary.

Upon the ink layers transferred onto the associated substrate, the associated substrate is fired into a PDP as is the case with the use of the first transfer sheet.

The third transfer sheet and pattern-forming method of the present invention contribute to an improvement in transferability as in the case of the second transfer sheet because a plurality of layers can be simultaneously formed by transfer, and enable a PDP to be fabricated with high alignment precision because inter-layer alignment can be carried out at the stage of the transfer sheet.

The fourth pattern-forming method of the present invention will now be described.

The fourth pattern-forming method is a modified embodiment of the aforesaid first pattern-forming method.

Figure 15:
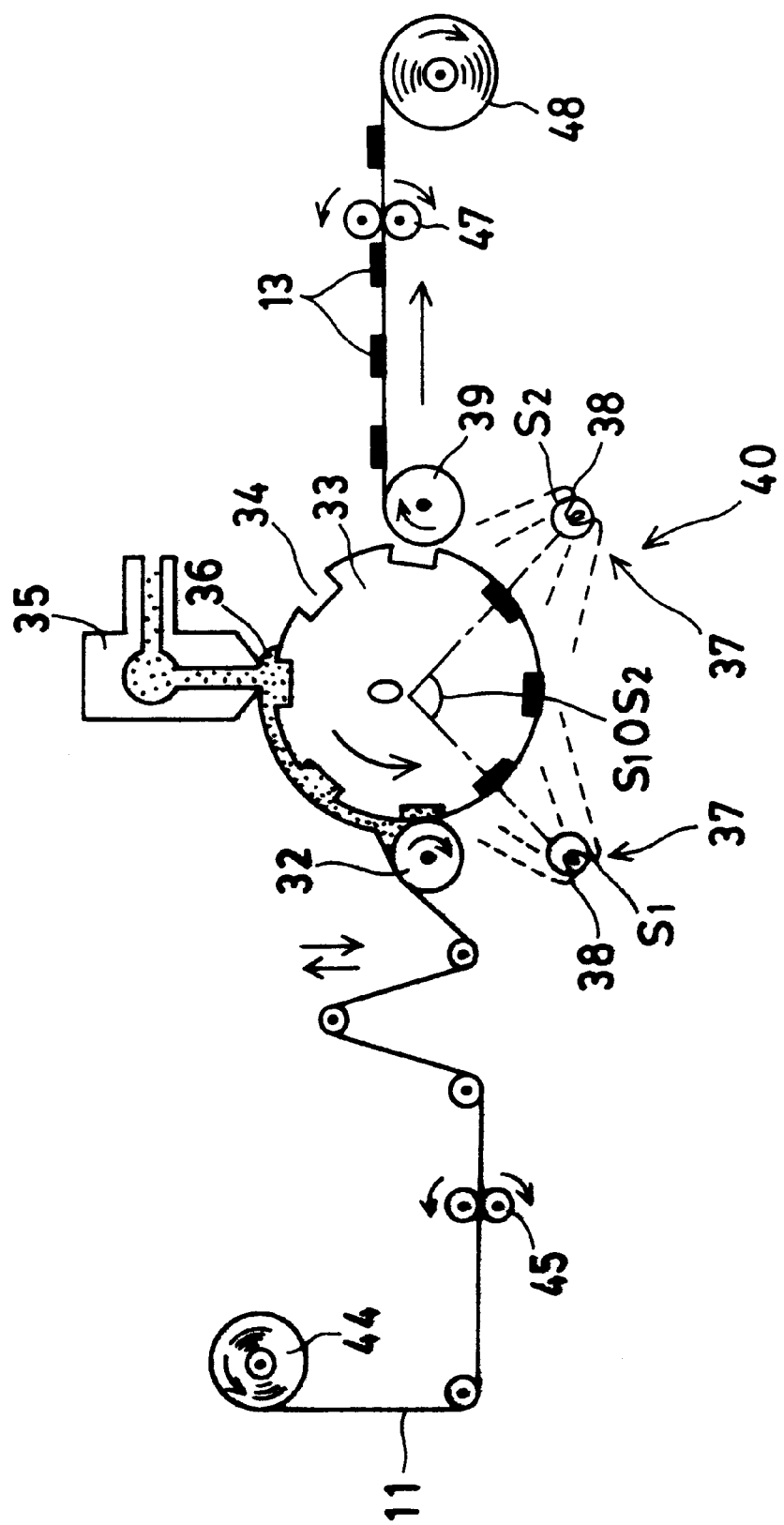
FIG. 15 is a schematic illustrative of a transfer sheet-forming apparatus for carrying out the first to fourth steps in the fourth pattern-forming method according to the present invention.

FIG. 15 is a schematic illustrative of first to fourth steps in the fourth pattern-forming method of the present invention. The first to fourth steps are carried out using a transfer sheet-forming apparatus. In FIG. 15, reference numerals 11 and 13 stand for a base film and a pattern-wise cured ink layer, and the same numerals as in FIG. 3 represent the same parts.

The transfer sheet-forming apparatus is built up of a feeding take-up roll 44 for feeding the base film 11, feeder rolls 45, compensator rolls 47, and receiving take-up roll 48. A coating section 40 is built up of a press roll 32 for applying pressure on the base film 11, a roll intaglio 33 engraved with depressions 34, an ink feeder 35 for coating an ink 36 (that is an uncured liquid at this time) onto the roll intaglio 33, a curing device 37 for curing and solidifying the liquid ink 36 filled in the depressions 34 in the roll intaglio 33, and a release roll 39.

At the coating section 40, pressure is so applied on the base film 11 by the press roll 32 that, at a position between the press roll 32 and the release roll 39, the base film 11 comes into close contact with the surface of the roll intaglio 33 with the ink 36 fed from the ink feeder sandwiched between them. The roll intaglio 33 is rotatably driven by a driving device (not shown) driven by an electric motor or the like in such a manner that the feeding speed of the base film 11 is synchronous with the peripheral speed of the roll intaglio 33. Between the roll intaglio 33 and the base film 11 in close contact with the roll intaglio 33 the ink 36 filled in the depressions 34 in the roll intaglio 33 is cured and solidified in an as-filled state by the curing device 37, so that the ink 36 is bonded onto the base film 11. Following this, the base film 11 is released from the roll intaglio 33 by the release roll 39, so that a transfer sheet having the pattern-wise cured ink layer 13 formed on the base film is obtained.

The press roll 32 may be any roll which can press the base film 11 onto the surface of the roll intaglio. More specifically, the press roll 32 has usually a diameter of about 50 mm to about 300 mm, and comprises a metal core which is covered therearound with silicone rubber, natural rubber or the like.

The curing device 37 may be selected from suitable devices depending on the type of the curable resin. However, it is preferable to use a device that can emit radiation such as electromagnetic waves, and charged particle beams having an energy quantum enough to crosslink and polymerize the curable resin. Industrially available radiation may include infrared rays, visible rays, ultraviolet rays and electron beams as well as electromagnetic waves such as microwaves, and X-rays. When the curable resin is cured by ultraviolet rays, etc., it is preferable to control the crosslinking density in such a manner that the resin is partially cured. This is because if the partially cured resin is cured by ultraviolet rays, etc. for the purpose of pattern transfer while the transfer sheet is stacked on the substrate, it is then possible to improve the adhesion between the pattern and the substrate. In this case, either the film surface or the substrate surface may be irradiated with ultraviolet rays. In FIG. 15, reference numeral 38 represents a reflector for efficiently directing radiation emitted from a radiation source toward the roll intaglio. It is noted that two such curing devices 37 are provided per roll intaglio, and that radiation sources $S_1$ and $S_2$ for these two curing devices are positioned in such a manner that an angle $S_1OS_2$ between lines $S_1O$ and $S_2O$ where O is the center of the roll intaglio is within the range of 70° to 110°, and preferably 90°.

The roll intaglio 33 is preferably provided with given depressions 34 by suitable means such as electronic engraving, etching, milling, and electroforming, and is formed of metals such as copper, and iron having a chrome plated surface; ceramics such as glass, and quartz; and synthetic resins such as acryl resin, and silicone resin. Alternatively, a rolled sheet having a pattern of an ionizing radiation-curable resin, etc. formed on its outer surface may be used. Although not critical in size, the roll intaglio has usually a diameter of about 150 to about 1,000 mm and a line width of about 300 to about 2,000 mm.

The size and shape of the depressions 34 formed in the roll intaglio may be determined corresponding to the desired pattern shape.

The base film 11 may be the same as the base film in the first transfer sheet, and the ink 36, when it is used for a barrier layer, etc., is composed of an inorganic component comprising at least a glass frit and a curable resin component that is to be removed by firing.

The inorganic component comprising a glass frit may be the same as that in the ink layer 13 in the first transfer sheet that forms a barrier layer, etc., and the curable resin component that is to be removed by firing may again be the same as the ionizing radiation- or heat-curable resin in the ink layer 13 in the first transfer sheet.

The ink 36, when the ink layer is used as an electrode-forming layer, is composed of an inorganic component comprising at least a glass frit, a curable resin component that is to be removed by firing, and an electroconductive power.

The inorganic component comprising a glass frit, and the electroconductive powder may be the same as those in the ink layer 13 in the first transfer sheet that forms an electrode layer, and the curable resin component that is to be removed by firing may again be the same as the ionizing radiation- or heat-curable resin in the ink layer 13 in the first transfer sheet.

Figure 16:
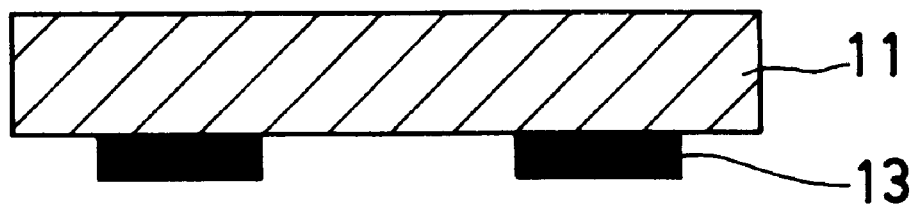
FIGS. 16(a), 16(b) and 16(c) are schematics illustrative of the fifth and sixth steps in the fourth pattern-forming method according to the present invention.
Figure 16:
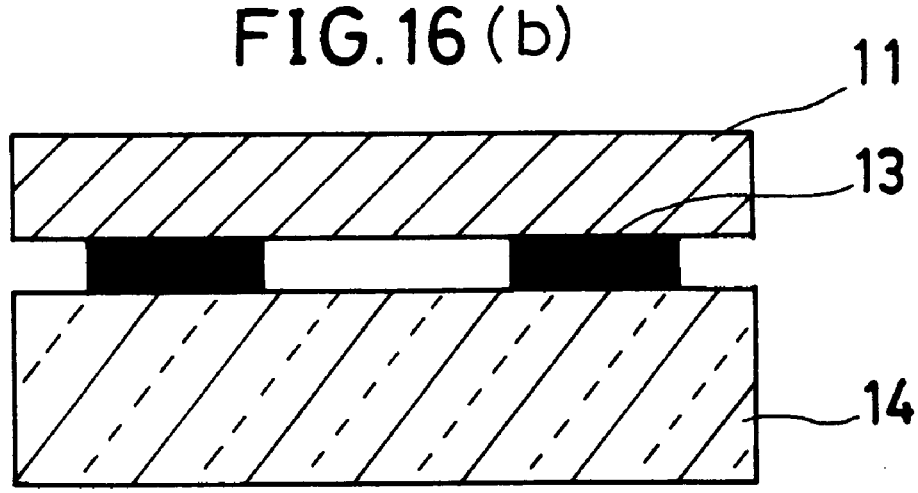
Figure 16:
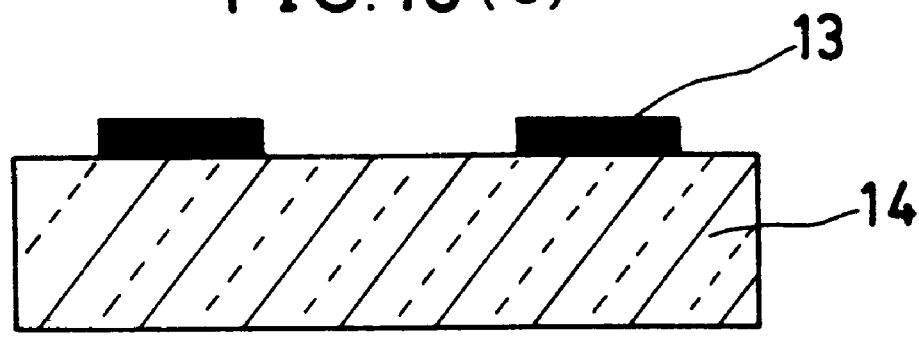

FIG. 16 illustrates fifth and sixth steps in the pattern-forming method of the present invention, in which the transfer sheet prepared by the first to fourth steps is used for the transfer of a pattern-wise cured ink layer. In FIG. 16, reference numeral 14 is a glass substrate.

More specifically, FIG. 16(a) is a sectional schematic of the transfer sheet prepared by the first to fourth steps. As can be seen from FIG. 16(b), the transfer sheet is transferred from the side of the pattern-wise cured ink layer 13 onto the glass substrate 14. Then, as can be seen from FIG. 16(c), the base film 11 is released from the cured ink layer 13 so that the pattern-wise cured ink layer 13 is formed on the glass substrate 14.

If necessary, the transfer sheet shown in FIG. 16(a) may be provided on the pattern-wise ink layer 13 with a protective film to be described later.

While the transfer sheet has been described as being rolled around the take-up roll 48, it is understood that the cured ink layer 13 may be transferred onto the glass substrate 14 before it is rolled up.

Referring here to FIG. 16(b), when the pattern-wise cured ink layer 13 is an electrode pattern, it is preferably stacked on the glass substrate through a fired primer layer or an unfired primer-forming layer. For the unfired primer-forming layer, an ink layer composed of an inorganic component comprising at least a glass frit and a thermoplastic or curable resin is coated and dried to form a primer-forming layer. Then, the primer-forming layer is thermally pressed on the transfer sheet shown in FIG. 16(a) or cured for the transfer of the pattern-wise cured ink layer 13. For the fired primer layer, on the other hand, transferability is obtainable by use of an adhesive that is to be removed by firing.

When the pattern-wise cured ink layer is a barrier layer, the transfer sheet is superposed on the glass substrate on which a fired primer layer or an unfired primer-forming layer, an electrode-forming layer and a fired dielectric layer or an unfired dielectric layer-forming layer have been stacked in the described order, followed by the stacking of the pattern-wise cured ink layer thereon. It is here noted that the primer layer or primer-forming layer may, or may not, be used.

It is possible to obtain the transferability of the pattern-wise cured ink layer 12 by using an unfired dielectric layer-forming layer composed of an inorganic component comprising at least a glass frit and a thermoplastic or curable resin, and thermally pressing the dielectric layer-forming layer on the transfer sheet or curing the dielectric layer-forming layer. For the fired dielectric layer it is also possible to obtain transferability using an adhesive to be removed by firing.

The transfer sheet may be thermally pressed on the substrate 14 by suitable means such as heat rolls, laser light, heat presses or the like. In FIG. 15, the ink layer is cured at a time when it is formed on the base film 11. However, the ink layer 13 may be cured after formed on the base film 11.

The glass substrate with the pattern-wise cured ink layer 13 transferred onto it is fired at a firing temperature of 350° C. to 650° C. to gasify, decompose and volatilize the organic component in the ink layer, so that the inorganic powders are intimately bonded together by molten glass frits.

The pattern-forming method using the transfer sheet of the present invention is particularly suitable for the formation of ultrafine patterns for electrode layers, barrier layers, etc., and enables such ultrafine patterns to be fabricated at low costs or in high yields for a reduced time of period. It is also possible to obtain patterns which are excellent in surface smoothness, have a uniform thickness, and are of good profile precision.

Especially when the transfer sheet according to the present invention is used to form an electrode layer in a PDP, it is possible to simultaneously form primer and electrode layers by firing if the transfer sheet is stacked on the glass substrate with the aforesaid primer-forming layer sandwiched between them. Also, when a barrier layer is formed, it is possible to simultaneously primer, electrode, dielectric and barrier layers by firing, if the transfer sheet is stacked on the glass substrate with the aforesaid primer-, electrode- and dielectric layer-forming layers sandwiched between them.

Each ink layer in each of the transfer sheets according to the present invention may be provided on its surface with a protective film which prevents it from being injured, contaminated with dust or the like, and blocked.

The protective film, for instance, may be formed of films such as those of polyethylene terephthalate, 1,4-polycyclohexylenedimethylene terephthalate, polyethylene naphthalate, polyphenylene sulfide, polystyrene, polypropylene, polysulfone, aramid, polycarbonate, polyvinyl alcohol, cellophane, cellulose derivative such as cellulose acetate, polyethylene, polyvinyl chloride, nylon, polyimide, and ionomer, and may be treated on its lamination surface with release agents such as silicone, acrylmelamine, wax, and so on. The protective film has a thickness of 1 $\mu$m to 400 $\mu$m, and preferably 4.5 $\mu$m to 200 $\mu$m.

While the transfer sheet obtained by filling the ink in the depressions in the base film and, if necessary, provided with the protective film may temporarily be rolled up, it is understood that the base film may be cut to the required length, and then filled therein with the ink for transfer.

The fifth pattern-forming method of the present invention will now be explained.

The fifth pattern-forming method is another modified embodiment of the aforesaid first pattern-forming method, and is particularly suitable for the formation of electrode, barrier or other layers in PDPs or the like.

FIG. 17 illustrates the fifth pattern-forming method. In FIG. 17, reference numerals 60 and 19 represents an intaglio and a release agent layer, respectively, and the same numerals as in FIG. 5 indicate the same parts.

Figure 17A:
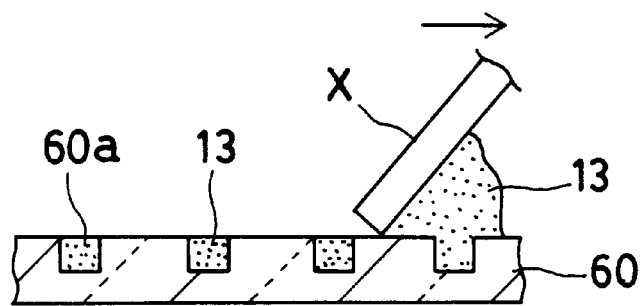
FIGS. 17(a) to 17(e) are schematics illustrative of one embodiment of steps in the fifth pattern-forming method according to the present invention.

As depicted in FIG. 17(a), the intaglio 60 having depressions 60a corresponding to a desired pattern is first provided. Then, a photo-curable ink layer 13 is filled in the depressions 60a by means of a squeegee X. The intaglio 60 may be formed of a metal or glass plate, and the depressions 60a may be formed by means of sand blasting or etching. The photo-curable ink layer may be formed by kneading an acrylate or methacrylate base photo-polymerizable monomer or oligomer with an inorganic powder.

Figure 17B:
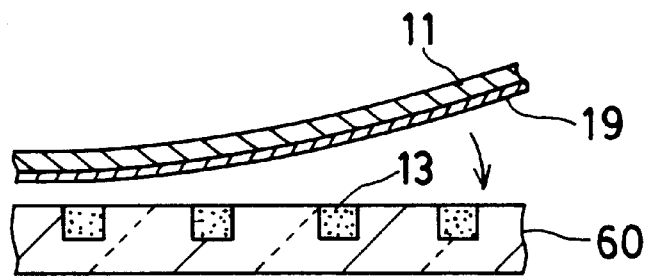

Then, as depicted in FIG. 17(b), a base film 11 having the release agent layer 19 formed thereon is laminated on the intaglio 60 while the release agent layer 19 is opposite to the depressions 60a.

Figure 17C:
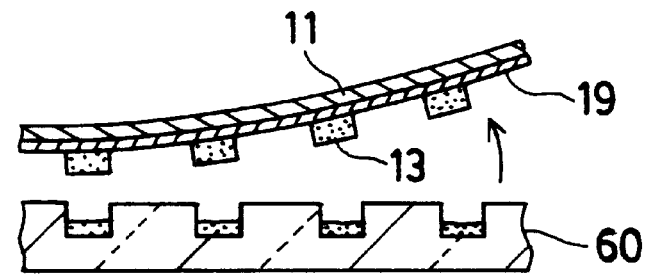

Upon the base film 11 being released from the intaglio 60 as depicted in FIG. 17(c), the ink layer 13 is transferred from within the depressions 60a onto the base film 11, so that a first transfer sheet is formed. In this case, 50 to 60% of the ink layer 13 filled is transferred onto the base film 11.

Figure 17D:
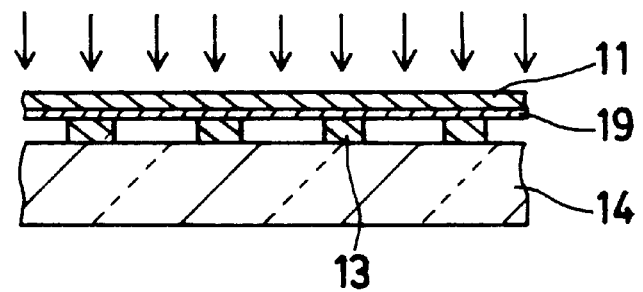
Figure 17E:
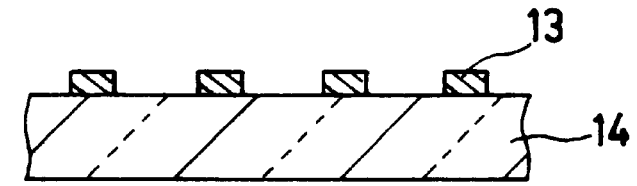

Subsequently, as depicted in FIG. 17(d), the base film 11 is superposed on the glass substrate 14 in such a manner that the ink layer 13 comes into contact therewith. In this state, the stack is irradiated with ultraviolet rays to increase the adhesion strength of the ink layer 13 to the glass substrate 14. Following this, the base film 11 is released from the ink layer 13 to leave the ink layer 13 on the glass substrate 14. Finally, the substrate is overall fired to bring the ink layer 13 into close contact with the glass substrate 14 so that an electrode, barrier or other pattern 13 is formed on the glass substrate 14, as depicted in FIG. 17(e).

In the practice of the fifth pattern-forming method of the present invention, it is also possible to omit the fabrication of the transfer sheet, as mentioned below.

FIG. 18 illustrates steps used in the aforesaid embodiment. In FIG. 18, reference numerals 21 and 22 stand for an adhesive layer and a mask, respectively, and the same numerals as in FIG. 17 indicate the same parts.

Figure 18A:
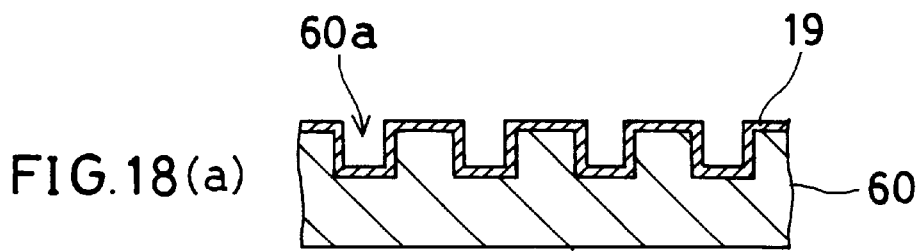
FIGS. 18(a) to 18(e) are schematics illustrative of another embodiment of steps in the fifth pattern-forming method according to the present invention.

As depicted in FIG. 18(a), provision is made of an intaglio 60 having depressions 60a corresponding to a desired pattern and having a release agent layer 19 on an irregular surface of the side thereof having the depressions 60a. Such an intaglio may be obtained by sand blasting or etching a metal or glass plate to form depressions therein, and coating a silicone or other release agent on the irregular surface for release treatments.

Figure 18B:
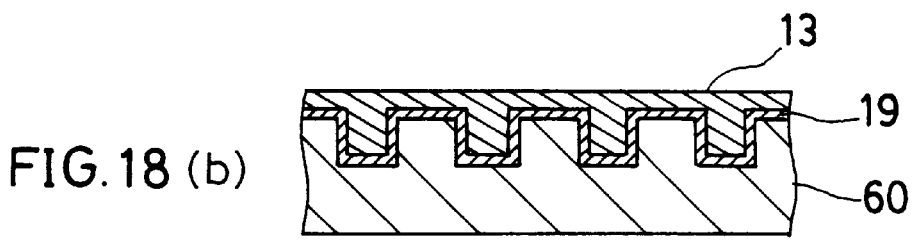

Then, as depicted in FIG. 18(b), a photo-curable ink layer 13 is coated on the surface of the intaglio 60 including the depressions 60a. For the photo-curable ink layer it is preferable to use an ink that is liquid at normal temperature and has a curing shrinkage of 10%.

Figure 18C:
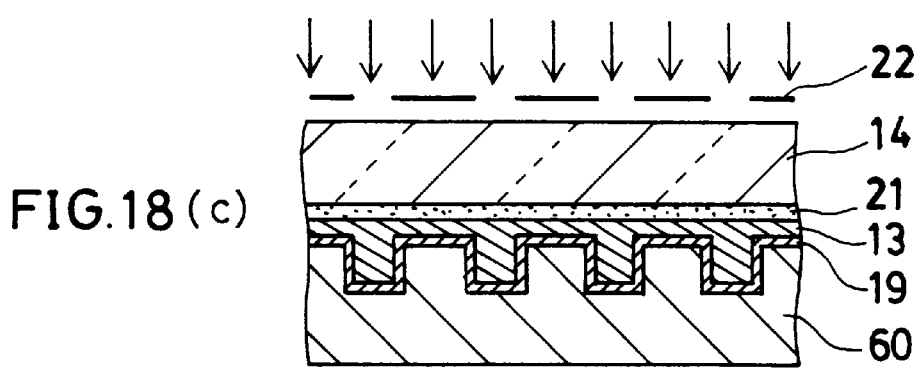

Then, as depicted in FIG. 18(c), a glass substrate 14 is pressed on the coated ink layer 13 with a photo-curable adhesive 21 sandwiched between them. In this state, the stack is exposed to ultraviolet rays using the mask 22 corresponding to the depressions 60a. By this exposure only the ink layer 13 within the depressions 60a and only the adhesive 21 on the depressions 60a are cured. In this case, the ink layer 13 shrinks so that the ink layer 13 is easily releasable from within the depressions 60a. It is noted that a non-photo-curable adhesive or tackifier may be used for the adhesive 21. In view of compatibility with the ink layer 13, however, it is preferable to use a photo-curable adhesive.

Figure 18D:
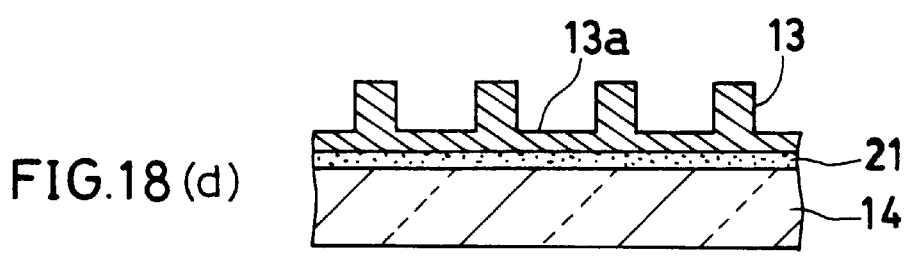
Figure 18E:
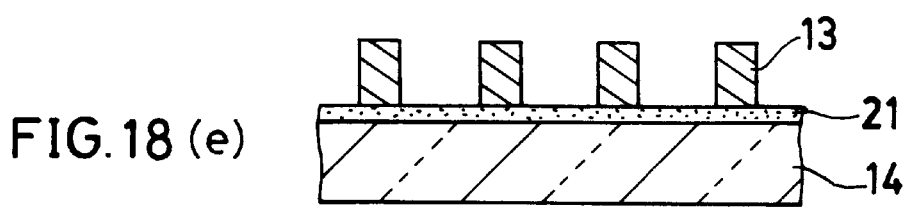

Subsequent releasing of the glass substrate 14 from the intaglio 60 causes the ink layer 13 to be transferred onto the glass substrate 14, as depicted in FIG. 18(d). If, here, a non-pattern area 13a is transferred together with the ink layer 13 onto the glass substrate, as shown, that area is removed by blasting or development so that, as depicted in FIG. 18(e), only the pattern area of the ink layer is left behind. It is here noted that the non-pattern area 13a is an unexposed area, and so is removable by development. Finally, the substrate is overall fired to bring the ink layer into close contact with the substrate.

The present invention will now be explained at great length with reference to examples.

The first transfer sheet, and first pattern-forming method of the present invention will first be explained with reference to Examples 1 to 5.

EXAMPLE 1

An ultraviolet-curable type ink (DKF-901 made by Nippon Kayaku K.K.) was charged in the apparatus shown in FIG. 3, and a 75-$\mu$m thick polyethylene terephthalate film was used as the base film. Using a radiation source emitting ultraviolet rays (600 mJ/cm$^2$) and a roll intaglio rotating at 5 m/min. rpm, a depressed electrode pattern having a line width of 70 $\mu$m and a depth of 20 $\mu$m was formed on the base film at a pitch of 200 $\mu$m, as shown in FIG. 1.

Then, the following composition comprising:

| | |
|---|---|
| silver powders (average particle diameter: 1 $\mu$m) | 80 pbw |
| glass frits (free from alkali and composed mainly of PbO, SiO$_2$, B$_2$O$_3$ with an average particle size of 1 $\mu$m, a softening point of 500° C., and a coefficient of thermal expansion $\alpha_{300}$ = 75 × 10$^{-7}$/°C.) | 5 pbw |
| polybutene (200N made by Nippon Yushi K. K.) | 8 pbw |
| polybutene (5N made by Nippon Yushi K. K.) | 2 pbw | was mixed and dispersed in a three-roll ink mill to prepare an ink for forming an electrode-forming layer. This ink was coated on the base film having depressions by doctoring to fill the ink in the depressions. Finally, a polyethylene film was laminated on the base film to form the first transfer sheet of the present invention. It is noted that the "pbw" used herein is an abbreviation of part by weight.

The transfer sheet, from which the polyethylene film had been released, was laminated on a glass substrate having a primer layer under transfer conditions, i.e., a preheated substrate temperature of 80° C. and a laminating roll temperature of 100° C., using an auto-cutting laminator (Model ACL-9100 made by Asahi Chemical Industry Co., Ltd.).

Then, the base film was released for the transfer of the ink layer, and firing was carried out at a peak temperature of 570° C. to form a pattern-wise electrode layer. Upon firing, the electrode layer was found to have a line width of 65 $\mu$m and a thickness of 7±2 $\mu$m.

EXAMPLE 2

Following Example 1 provided that the depression pattern v shape in the base film was a barrier layer pattern, depressions having a bottom width of 70 $\mu$m, a ceiling width of 100 $\mu$m and a depth of 180 $\mu$m was formed at a pitch of 250 $\mu$m.

The following composition comprising:

| | |
|---|---|
| glass frits (MB-008 made by Matsunami Glass Kogyo K. K.) | 65 pbw |
| $\alpha$-alumina RA-40 (made by Iwatani Kagaku Kogyo K. K.) | 10 pbw |
| Dipyroxide Black #9510 (made by Dainichi Seika Kogyo K. K.) | 10 pbw |
| n-butyl methacrylate/2-hydroxyethyl methacrylate copolymer (8/2) | 8 pbw |
| polyoxyethylated trimethylolpropane triacrylate | 8 pbw |
| silicone resin (X-24-8300 made by The Shin-Etsu Chemical Co., Ltd.) | 1 pbw |
| photo-initiator (Irgacure 369 made by Ciba Geigy) | 3 pbw |
| propylene glycol monomethyl ether | 10 pbw |
| isopropyl alcohol | 10 pbw | was mixed and dispersed in a bead mill using ceramic beads to prepare a barrier layer-forming ink.

This ink was filled in depressions in the aforesaid base film by doctoring, followed by drying at 100° C. for 5 minutes. Then, a polyethylene film was laminated on the base film to form the first transfer sheet of the present invention.

The transfer sheet, from which the polyethylene film had been released, was laminated on a glass substrate with a primer layer, an electrode layer and a dielectric layer stacked thereon in the described order under transfer conditions, i.e., a preheated substrate temperature of 80° C. and a laminating roll temperature of 100° C., using an auto-cutting laminator (Model ACL-9100 made by Asahi Chemical Industry Co., Ltd.).

Then, the base film was released, and firing was carried out at a peak temperature of 570° C. Upon firing, the resultant barrier layer was found to have a ceiling width of 50 $\mu$m, a bottom width of 80 $\mu$m and a thickness of 120±10 $\mu$m.

EXAMPLE 3

Following Example 1 provided that the depression pattern shape in the base film was a barrier layer pattern, depressions having a bottom width of 70 $\mu$m, a ceiling width of 100 $\mu$m and a depth of 180 $\mu$m was formed at a pitch of 250 $\mu$m.

Barrier-forming Material Comprising Dark Ink

The following composition comprising:

| | |
|---|---|
| glass frits (free from alkali and composed mainly of PbO, SiO$_2$, and B$_2$O$_3$) | 53 pbw |
| $\alpha$-alumina RA-40 (made by Iwatani Kagaku Kogyo K. K.) | 12 pbw |
| Dipyroxide Black #9510 (made by Dainichi Seika Kogyo K. K.) (the aforesaid inorganic component mixture having a coefficient of thermal expansion of (30 to 300° C.) 74 × 10$^7$ and a softening point of 580° C.) | 8 pbw |
| n-butyl methacrylate/2-hydroxyethyl methacrylate copolymer (7/3) | 5 pbw |
| bis (2-ethylhexyl) phthalate | 3 pbw |
| dibutyl phthalate | 5 pbw |
| propylene glycol monomethyl ether | 10 pbw |
| N-methyl-2-pyrrolidone | 10 pbw | was mixed and dispersed in a bead mill using ceramic beads to prepare a dark barrier layer-forming ink.

Barrier-forming Material Comprising White Ink

The following composition comprising:

| | |
|---|---|
| glass frits (free from alkaki and composed mainly of PbO, SiO$_2$ and B$_2$O$_3$) | 53 pbw |
| $\alpha$-alumina RA-40 (made by Iwatani Kagaku Kogyo K. K.) | 12 pbw |
| titanium oxide (the aforesaid inorganic component mixture having a coefficient to thermal expansion of (30 to 300° C.) 72 × 10$^7$ and a softening point of 575° C.) | 8 pbw |
| n-butyl methacrylate/2-hydroxyethyl methacrylate copolymer (7/3) | 5 pbw |
| bis (2-ethylhexyl) phthalate | 3 pbw |
| dibutyl phthalate | 5 pbw |
| propylene glycol monomethyl ether | 10 pbw |
| N-methyl-2-pyrrolidone | 10 pbw | was mixed and dispersed in a bead mill using ceramic beads to prepare a white barrier layer-forming ink.

First, the dark ink was coated at a thickness of 40 $\mu$m by means of doctoring, and then the white ink was coated on the dark ink layer again by means of doctoring to fill an ink layer with the white ink layer stacked on the dark ink layer in depressions in the base film obtained as mentioned above, followed by drying at 150° C. for 30 minutes. A polyethylene film was laminated on the stack to form the first transfer sheet of the present invention.

The transfer sheet, from which the polyethylene film had been released, was laminated on a glass substrate with a primer layer, an electrode layer and a dielectric layer stacked thereon in the described order under transfer conditions, i.e., a preheated substrate temperature of 80° C. and a laminating roll temperature of 100° C., using an auto-cutting laminator (Model ACL-9100 made by Asahi Chemical Industry Co., Ltd.).

Then, the base film was released, and firing was carried out at 570° C. Upon firing, the resultant barrier layer was found to have a ceiling width of 50 μm, a bottom width of 80 μm and a thickness of 120±10 μm.

A PDP assembled using this fired product was found to be excellent in contrast.

EXAMPLE 4

Preparation of Transfer Sheet

A 25-μm thick polyethylene terephthalate film (T-60 made by Toray Industries, Inc.) was used as a film material. Using the apparatus shown in FIG. 3, a roll intaglio having depressed spaces, each being of a regular quadrangular pyramid shape, and an ionizing radiation-curable resin composition under the following conditions, a female die for a cell barrier portion having an irregular shape opposite to that of a cell barrier was formed on one side of the polyethylene terephthalate film to obtain a first transfer sheet.

(1) Roll intaglio

Figure 19:
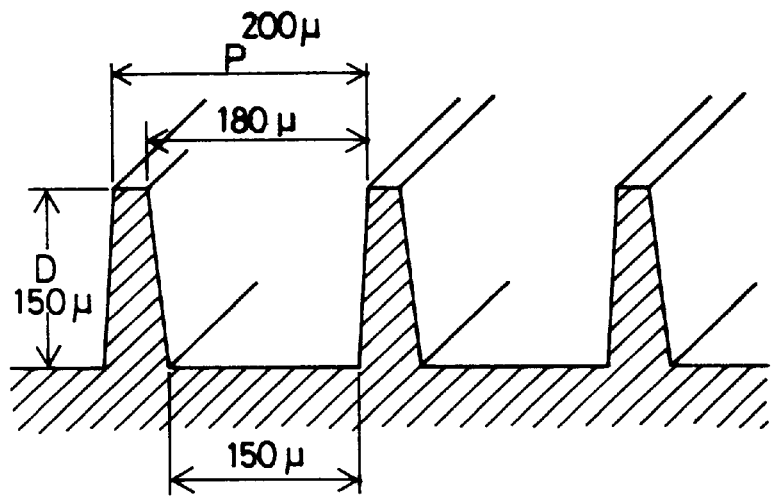
FIG. 19 is a combined sectional and perspective schematic illustrative of one embodiment of depressions in a roll intaglio.

Sectional shape of the intaglio surface:
    Discrete trapezoids in longitudinal section, and striped in horizontal section, as shown in FIG. 19.

| | |
|---|---|
| Cell pitch: | 200 μm |
| Cell groove width W: | upper bottom of 180 μm, and lower bottom of 150 μm |
| Cell depth D: | 150 μm |

(2) Ionizing radiation-curable resin composition

| | |
|---|---|
| Pentaerythritol triacryate | 90 pbw |
| Urethane acrylate oligomer | 10 pbw |

(3) Irradiation conditions

Irradiated with electron beams of 10 Mrad using a curtain beam type electron beam irradiator.

An ink having low-melting glass frits, heat-resistant pigment, etc. dispersed in an organic binder was filled in the female die in the transfer sheet, and the surface of the resultant ink layer was then brought into contact with a PDP glass substrate. The transfer sheet was released to transfer the ink layer onto the glass substrate.

Then, the glass substrate having the ink layer transferred in a cell barrier form was fired at a peak temperature of 585° C. for a heating time of 15 minutes to form a cell barrier on the PDP glass substrate.

EXAMPLE 5

Preparation of Transfer Sheet

A cell barrier was formed on a glass substrate following Example 4 with the exception that the roll intaglio, ionizing radiation-curable resin composition, and irradiation conditions used for transfer sheet fabrication were changed as mentioned below.

(1) Roll intaglio

Figure 20:
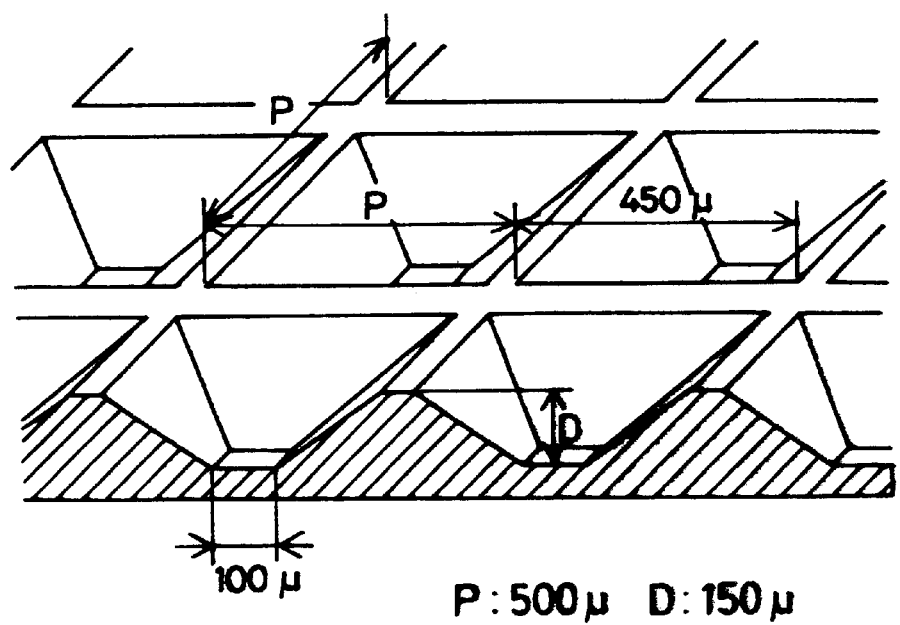
FIG. 20 is a combined sectional and perspective schematic illustrative of another embodiment of depressions in a roll intaglio.

Sectional shape of the intaglio surface:
    Discrete trapezoids in longitudinal section, and squares in horizontal section, as shown in FIG. 20.

| | |
|---|---|
| Cell pitch: | 500 μm |
| Cell groove width W: | upper bottom of 450 μm, and lower bottom of 100 pm |
| Cell depth D: | 150 μm |

(2) Ionizing radiation-curable resin composition

| | |
|---|---|
| Pentaerythritol triacryate | 90 pbw |
| Urethane acrylate oligomer | 10 pbw |
| 2-Hydroxy-2-methyl-1-phenylpropan-1-one (Dalocure 1173 made by Merck) | 0.7 pbw |

(3) Irradiation conditions

Two ozone-containing high-pressure mercury lamps at 160 W/cm

Then, the second transfer sheet, and second pattern-forming method of the present invention will now be explained with reference to Example 6.

EXAMPLE 6

Formation of Base Film

An ultraviolet-curable type ink (Seika Beam XD-808 made by Dainichi Seika Kogyo K.K.) was charged in the apparatus shown in FIG. 3, and a 100-μm thick polyethylene terephthalate film was used as the base film. Using a radiation source emitting ultraviolet rays (160 W/cm$^2$) and a roll intaglio rotating at 5 m/min. rpm, a barrier layer was formed on the base film to form depressions having a bottom width of 70 μm, a ceiling width of 100 μm and a depth of 180 μm at a pitch of 250 μm.

First, the dark ink as referred to in Example 3 was coated at a thickness of 40 μm by means of doctoring, and then the white ink as described in Example 3 was coated on the dark ink layer again by means of doctoring to fill an ink layer with the white ink layer stacked on the dark ink layer in depressions in the base film obtained as mentioned above, followed by drying at 150° C. for 30 minutes.

Dielectric-forming Layer

The following composition comprising:

| | |
|---|---|
| glass frits (free from alkali, composed mainly of Bi$_2$O$_3$, ZnO, and B$_2$O$_3$ and having an average particle size of 3 μm) | 70 pbw |
| α-alumina RA-40 (made by Iwatani Kagaku Kogyo K. K.) | 7 pbw |
| titanium oxide (the aforesaid inorganic component mixture having a coefficient of thermal expansion of (30 to 300° C.) 81 × 10$^7$ and a softening point of 580° C.) | 3 pbw |
| n-butyl methacrylate/2-hydroxyethyl methacrylate copolymer (7/3) | 13 pbw |
| dibutyl phthalate | 7 pbw |
| propylene glycol monomethyl ether | 20 pbw | was mixed and dispersed in a bead mill using ceramic beads to prepare a dielectric layer-forming ink.

This dielectric layer-forming ink was coated by screen printing on a concave pattern obtained by filling the barrier-forming ink in depressions in the base film obtained as mentioned above to form a dielectric layer pattern, as shown in FIG. 8, and drying was carried out at 150° C. for 30 minutes to stack a 20-μm thick dielectric-forming layer on the concave pattern. Then, a polyethylene film was laminated on the dielectric-forming layer to obtain the second transfer sheet of the present invention. The barrier-forming layer was covered with the dielectric-forming layer ink, and was found to be excellent in shape.

The transfer sheet, from which the polyethylene film had been released, was laminated on a glass substrate with a primer layer and an electrode layer stacked thereon in the described order under transfer conditions, i.e., a preheated substrate temperature of 80° C. and a laminating roll temperature of 100° C., using an auto-cutting laminator (Model ACL-9100 made by Asahi Chemical Industry Co., Ltd.).

Then, the base film was released, and firing was carried out at 570° C. Upon firing, the resultant dielectric layer was found to have a thickness of 10 μm, and the resultant barrier layer was found to have a ceiling width of 50 μm, a bottom width of 80 μm and a thickness of 120±10 μm.

Then, the third transfer sheet, and third pattern-forming method of the present invention will now be explained with reference to Examples 7 to 9.

EXAMPLE 7

Electrode-forming Ink

The following composition comprising:

| | |
|---|---|
| silver powders (average particle size: 2 μm) | 70 pbw |
| glass frits (free from alkali and having an average particle size of 1 μm, a softening point of 550° C. and a coefficient of thermal expansion of (30 to 300° C.) 73 × 10$^7$) | 5 pbw |
| n-butyl methacrylate/2-hydroxyethyl methacrylate copolymer (7/3) | 12 pbw |
| dibutyl phthalate | 5 pbw |
| propylene glycol monomethyl ether | 15 pbw | was mixed and dispersed in a bead mill using ceramic beads to prepare an electrode-forming ink.

This electrode-forming ink was coated by screen printing on the dielectric-forming layer in the second transfer sheet obtained in Example 6, from which the polyethylene film had been released, to form an electrode pattern which, in turn, was dried at 150° C. for 30 minutes to form a 20-μm thick electrode-forming layer, and a polyethylene film was further laminated thereon to form the third transfer sheet of the present invention such as one shown in FIG. 11.

The transfer sheet, from which the polyethylene film had been released, was laminated on a glass substrate with a primer layer stacked thereon under transfer conditions, i.e., a preheated substrate temperature of 80° C. and a laminating roll temperature of 100° C., using an auto-cutting laminator (Model ACL-9100 made by Asahi Chemical Industry Co., Ltd.).

Then, the base film was released, and firing was carried out at 570° C. Upon firing, the resultant electrode layer was found to have a thickness of 10 μm, the resultant dielectric layer was found to have a thickness of 10 μm, and the resultant barrier layer was found to have a ceiling width of 50 μm, a bottom width of 80 μm and a thickness of 120±10 μm.

EXAMPLE 8

Photosensitive Electrode-forming Ink

The following composition comprising:

| | |
|---|---|
| spherical silver powders (average particle size: 2 μm) | 70 pbw |
| glass frits (free from alkali and having an average particle size of 1 μm, a softening point of 550° C. and a coefficient of thermal expansion of (30 to 300° C.) 73 × 10$^7$) | 5 pbw |
| photosensitive resin component (which comprises 50 pbw of an alkali-development type polymer (that is a methyl methacrylate/methacrylic acid copolymer having 7 mol% of a double bond in its side chain and an acid number of 100 mgKOH/g), 30 pbw of an ethylene oxide-modified trimethylolpropane triacrylate, 3 pbw of a photo-initiator (Irgacure 369 made by Ciba Geigy), and 15 pbw of propylene glycol monomethyl ether.) | 18 pbw | was mixed and dispersed in a bead mill using ceramic beads to prepare a photosensitive electrode-forming ink.

The photosensitive electrode-forming ink was coated by doctoring on the dielectric-forming layer in the second transfer sheet obtained in Example 2, from which the polyethylene film had been released to obtain a film having an as-dried thickness of 20 μm.

The obtained multilayer sheet was irradiated from the base film side with ultraviolet rays (200 mJ/cm$^2$), and the electrode-forming layer was then developed with a 0.2% aqueous solution of sodium carbonate for removal of an exposed portion.

The barrier-forming layer acted as a mask, and so the electrode-forming layer could be formed while it was in good alignment with the barrier-forming layer.

After drying, a polyethylene film was applied on the electrode-forming layer to form the third transfer sheet of the present invention such as one shown in FIG. 11.

The transfer sheet, from which the polyethylene film had been released, was laminated on a glass substrate with a primer layer stacked thereon under transfer conditions, i.e., a preheated substrate temperature of 80° C. and a laminating roll temperature of 100° C., using an auto-cutting laminator (Model ACL-9100 made by Asahi Chemical Industry Co., Ltd.).

Then, the base film was released, and firing was carried out at 570° C. Upon firing, the resultant electrode was found to have a thickness of 10 μm, the resultant dielectric layer was found to have a thickness of 10 μm, and the resultant barrier layer was found to have a ceiling width of 50 μm, a bottom width of 80 μm and a thickness of 120±10 μm.

EXAMPLE 9

Primer Layer-forming Ink

The following composition comprising:

| | |
|---|---|
| glass frits (free from alkali, composed mainly of PbO, SiO$_2$ and B$_2$O$_3$, and having a coefficient of thermal expansion of (30 to 300° C.) 82 × 10$^7$ and a softening point of 575° C.) | 65 pbw |
| α-alumina RA-40 (made by Iwatani Kagaku Kogyo K. K.) | 11 pbw |
| copper oxide (CuO) | 4 pbw |
| n-butyl methacrylate/2-hydroxyethyl methacrylate copolymer (8/2) | 11 pbw |

-continued

| benzylbutyl phthalate | 3 pbw |
|---|---|
| dibutyl phthalate | 3 pbw |
| propylene glycol monomethyl ether | 20 pbw | was mixed and dispersed in a bead mill using ceramic beads to prepare an primer-forming ink.

The primer-forming ink was coated by screen printing on the electrode-forming layer in the transfer sheet obtained in Example 8, from which the polyethylene film had been released, to form a primer pattern which, in turn, was dried to form a primer-forming layer having an as-dried thickness of 20 µm. Then, a polyethylene film was applied on the primer-forming layer.

The transfer sheet, from which the polyethylene film had been released, was laminated on a glass substrate under transfer conditions, i.e., a preheated substrate temperature of 80° C. and a laminating roll temperature of 100° C., using an auto-cutting laminator (Model ACL-9100 made by Asahi Chemical Industry Co., Ltd.).

Then, the base film was released, and firing was carried out at 570° C. Upon firing, the resultant primer layer was found to have a thickness of 10 µm, the resultant electrode was found to have a thickness of 10 µm, the resultant dielectric layer was found to have a thickness of 10 µm, and the resultant barrier layer was found to have a ceiling width of 50 µm, a bottom width of 80 µm and a thickness of 120±10 µm.

The fourth pattern-forming method will now be explained with reference to Examples 10 to 13.

EXAMPLE 10

Formation of Transfer Sheet for Forming Electrode-forming Layer

The following composition comprising:

| photosensitive resin | 20 pbw |
|---|---|
| silver powders (average particle size: 1 µm) | 70 pbw |
| glass frits (free from alkali, composed mainly of $Bi_2O_3$, $SiO_2$ and $B_2O_3$, and having an average particle size of 1 µm and a softening point of 600° C.) | 5 pbw | was mixed and dispersed in a three-roll ink mill to prepare an ink for forming an electrode-forming layer. It is here noted that the aforesaid photosensitive resin comprises 100 pbw of a binder polymer or poly(n-butyl acrylate), 60 pbw of polyoxyethylated trimethylolpropane triacrylate, and 10 pbw of a photo-initiator or Irgacure 369 made by Ciba Geigy.

This ink for forming an electrode-forming layer was charged in the apparatus shown in FIG. 15, and a 75-µm thick polyethylene terephthalate film was used as the base film. Using a radiation source emitting ultraviolet rays (700 mJ/cm$^2$) and a roll intaglio rotating at 5 m/min. rpm, an electrode pattern or a cured ink layer having a line width of 70 µm and a thickness of 15 µm was formed to make a transfer sheet.

Formation of Associated Substrate

Then, the following composition comprising:

| glass frits (free from alkali, composed mainly of PbO, $SiO_2$, and $B_2O_3$, and having a softening point of 570° C., a Tg of 480° C., a coefficient of thermal expansion $\alpha_{300}$ of 83 × 10$^7$/°C. and an average particle size of 1 µm) | 65 pbw |
|---|---|
| $Al_2O_3$ | 11 pbw |
| CuO | 4 pbw |
| ethyl cellulose | 10 pbw |
| ethyl cellosolve | 20 pbw | was mixed and dispersed in a bead mill, then die coated on a glass substrate, and finally dried at 100° C. to form a primer-forming layer having a thickness of 18±2 µm.

Transfer Process

The transfer sheet obtained as mentioned above was superposed on an associated substrate for transfer under transfer conditions, i.e., a preheated substrate temperature of 80° C. and a laminating roll temperature of 100° C., using an auto-cutting laminator (ACL-9100 made by Asahi Chemical Industry Co., Ltd.).

Then, the base film was released for the transfer of a pattern-wise cured ink layer, and firing was then done at a peak temperature of 570° C. to form a pattern-wise electrode layer. Upon firing, the electrode layer was found to have a line width of 65 µm and a thickness of 6±2 µm, and to be excellent in surface smoothness as well.

EXAMPLE 11

Formation of Transfer Sheet for Forming Barrier Layer-forming Layer

The following composition comprising:

| photosensitive resin | 20 pbw |
|---|---|
| glass frits (MB-008 made by Matsunami Glass Kogyo K. K.) | 65 pbw |
| α-alumina RA-40 (Iwatani Kagaku Kogyo K. K.) | 10 pbw |
| Dipyroxide Black #9510 (made by Dainichi Seika Kogyo K. K.) | 10 pbw | was mixed and dispersed in a bead mill to prepare an ink for the formation of a barrier-forming layer. It is here noted that the aforesaid photosensitive resin comprises 100 pbw of poly(n-butyl acrylate) having an average molecular weight of 10,000, 40 pbw of polyoxyethylated trimethylolpropane triacrylate and 10 pbw of dibutyl phthalate.

This ink for forming a barrier-forming layer was charged in the apparatus shown in FIG. 15, and using a radiation source emitting electron beams (160 kV, 5 Mrad), a barrier pattern or a pattern-wise cured ink layer having a line width of 70 µm and a thickness of 180 µm was formed on a polyethylene terephthalate film for use for transfer onto the following associated substrate in an unrolled state.

Formation of the Associated Substrate

A primer-forming layer and a pattern-wise electrode-forming layer were provided on a glass substrate in the described order. Then, the following composition compris-ing:

| | |
|---|---|
| glass frits (free from alkali, composed mainly of $Bi_2O_3$, $ZnO_2$ and $B_2O_3$, and having an average particle size of 3 μm) | 70 pbw |
| $TiO_2$ | 3 pbw |
| $Al_2O_3$ | 7 pbw |
| (the aforesaid inorganic component mixture had a softening point of 570° C., a Tg of 485° C. and a coefficient of thermal expansion $\alpha_{300}$ of $80 \times 10^{-7}$/°C.) | |
| n-butyl methacrylate/hydroxyethylhexyl methacrylate copolymer (8/2) | 10 pbw |
| benzylbutyl phthalate | 7 pbw |
| isopropyl alcohol | 15 pbw |
| methyl ethyl ketone | 5 pbw | was mixed and dispersed in a bead mill, comma coated on a polyethylene terephthalate film, and dried at 100° C. to form a dielectric layer-forming layer having a thickness of 20±2 μm.

Transfer Process

While the transfer sheet obtained as mentioned above was superposed on the associated substrate, a pattern-wise cured ink layer was transferred. Then, the base film was released and firing was done at a peak temperature of 570° C. to form a pattern-wise barrier layer. Upon firing, the barrier layer was found to have a line width of 50 μm and a thickness of 120±10 μm, and to be excellent in surface smoothness as well.

EXAMPLE 12

A 25-μm thick polyethylene terephthalate film (T-60 made by Toray Industries, Inc.) was used as a film material. Using the apparatus shown in FIG. 15, a roll intaglio having depressed spaces, each being of a regular quadrangular pyramid shape, and an ionizing radiation-curable resin composition containing low-melting glass frits under the following conditions, a cured ink layer having a cell barrier portion shape was formed.

(1) Roll intaglio

Sectional shape of the intaglio surface:
 Discrete trapezoids in longitudinal section, and striped in horizontal section, as shown in FIG. 19.

| | |
|---|---|
| Cell pitch: | 200 μm |
| Cell groove width W: | upper bottom of 180 μm, and lower bottom of 150 μm |
| Cell depth D: | 150 μm |

(2) Ionizing radiation-curable resin composition containing low-melting glass frits

| | |
|---|---|
| Inorganic components (silicon dioxide, and lead oxide) | 75 pbw |
| Pentaerythritol triacrylate | 22 pbw |
| Urethane acrylate oligomer | 2 pbw |

(3) Irradiation conditions

Irradiated with electron beams of 10 Mrad using a curtain beam type electron beam irradiator.

Then, the barrier-forming layer provided on the polyester film, obtained as mentioned above, was pressed on a PDP glass substrate to form a barrier-forming layer on the glass substrate.

EXAMPLE 13

A cell barrier was formed on a glass substrate following Example 12 with the exception that the roll intaglio, ionizing radiation-curable resin composition, and irradiation conditions were changed as mentioned below.

(1) Roll intaglio

Sectional shape of the intaglio surface:
 Discrete trapezoids in longitudinal section, and squares in horizontal section, as shown in FIG. 20.

| | |
|---|---|
| Cell pitch: | 500 μm |
| Cell groove width W: | upper bottom of 450 μm, and lower bottom of 100 μm |
| Cell depth D: | 150 μm |

(2) Ionizing radiation-curable resin composition containing low-melting glass frits

| | |
|---|---|
| Inorganic components (silicon dioxide, and lead oxide) | 75 pbw |
| Pentaerythritol triacryate | 22 pbw |
| Urethane acrylate oligomer | 2 pbw |
| 2-Hydroxy-2-methyl-1-phenylpropan-1-one (Dalocure 1173 made by Merck) | 0.2 pbw |

(3) Irradiation conditions

Two ozone-containing high-pressure mercury lamps at 160 W/cm

What we claim is:

1. A transfer sheet comprising a base film not to be contracted or elongated by heat treatment, a concave pattern formed on one side of said base film, said concave pattern having a trapezoidal cross-section and having a shorter side closer to the base film, and an ink layer filled in a depressed space in said base film, said ink layer being composed of an inorganic component comprising at least a glass frit and a resinous composition that is to be removed by firing.

2. A transfer sheet according to claim 1, wherein said transfer sheet is polyethylene terephthalate film, polyethylene naphthalate film, polyphenylene sulfide film, polyimide film, aluminum sheet, copper sheet, 36Ni—Fe alloy sheet, 42Ni—Fe alloy sheet, or a composite sheet obtained from these sheets.

3. A transfer sheet according to claim 1, wherein said transfer sheet is a transfer sheet for fabricating a plasma display panel, and said ink layer is a barrier-forming layer.

4. A transfer sheet according to claim 1, wherein said transfer sheet is a transfer sheet for fabricating a plasma display panel, and said ink layer is an electrode-forming layer.

5. A pattern-forming method, comprising the steps of:

laminating a transfer sheet on an associated substrate from said ink layer side, said transfer sheet comprising a base film not to be contracted or elongated by heat treatment, a concave pattern formed on one side of said base film, said concave pattern having a trapezoidal cross-section and having a shorter side closer to the base film, and an ink layer filled in a depressed space in said base film, said ink layer being composed of an inorganic component comprising at least a glass frit and a resinous composition that is to be removed by firing;

transferring said ink layer on said associated substrate; and firing said associated substrate with said ink layer transferred thereon.

6. A pattern-forming method according to claim 5, wherein said pattern-forming method is a method for fabricating a plasma display panel, said associated substrate is a plasma display panel substrate, and said ink layer pattern is a plasma display panel member pattern.

7. A pattern-forming method, comprising the steps of:

laminating a transfer sheet on an associated substrate from said ink layer side, said transfer sheet comprising a base film not to be contracted or elongated by heat treatment, a concave pattern formed on one side of said base film, said concave pattern having trapezoidal cross-section and having a shorter side closer to the base film, and an ink layer filled in a depressed space in said base film, said ink layer being composed of an inorganic component comprising at least a glass frit and a resinous composition that is to be removed by firing;

transferring said ink layer on said associated substrate; and firing said associated substrate with said ink layer transferred thereon.

8. A pattern-forming method according to claim 7, wherein said pattern-forming method is a method for fabricating a plasma display panel, said associated substrate is a plasma display panel substrate, and said ink layer pattern is a plasma display panel member pattern.

* * * * *